United States Patent [19]
Wong et al.

[11] Patent Number: 5,098,868
[45] Date of Patent: Mar. 24, 1992

[54] VANADIUM-BASED SUPERCONDUCTING METALLIC OXIDES

[75] Inventors: Kai W. Wong, Lawrence; Wai-Yim Ching, Leawood, both of Kans.; Peter C. W. Fung, Victoria Road, Hong Kong; Fui T. Chan; Zhengzhi Sheng, both of Fayetteville, Ark.

[73] Assignee: University of Kansas, Lawrence, Kans.

[21] Appl. No.: 590,916

[22] Filed: Oct. 1, 1990

Related U.S. Application Data

[63] Continuation-in-part of Ser. No. 421,015, Oct. 13, 1989, abandoned.

[51] Int. Cl.$^5$ .................. C01B 13/00; C01F 11/02; C01G 31/02; H01L 39/12
[52] U.S. Cl. .................. 505/1; 252/521; 423/604; 423/617; 423/619; 501/123; 505/775; 505/776; 505/782
[58] Field of Search ............... 505/1, 775, 776, 782; 252/521; 423/604, 617, 619, 635, 641; 501/123

[56] References Cited

FOREIGN PATENT DOCUMENTS 0336621 10/1989 European Pat. Off.

OTHER PUBLICATIONS

Che "Composition and Superconductivity in . . . ", J. Mater. Sc. Vol. 24(5) May 1989, pp. 1775–1778.
Jones "Substitution of 3-d Transition Metal . . . ", Physica C vol. 162–164 (Part I) 1989 pp. 25–26.

Primary Examiner—Paul Lieberman
Assistant Examiner—John Boyd
Attorney, Agent, or Firm—Hovey, Williams, Timmons & Collins

[57] ABSTRACT

Vanadium-containing superconducting oxides are disclosed having critical temperature ($T_c$) values of above about 100° K. and preferably about 110°–150° K., together with predicted current density ($J_c$) values on the order of $10^4$–$10^5$ amperes/cm$^2$. The oxides hereof are moreover relatively ductile and easily bulk sintered to give end products having desirable superconductivity characteristics. Certain preferred oxides of the invention are defined by the general formula:

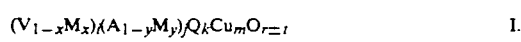

where M is selected from the group consisting of bismuth, lead and antimony, A is selected from the group consisting of calcium, sodium and potassium, Q is different than A and is selected from the group consisting of strontium, barium and calcium, x and t are individual numbers each respectively ranging from 0 to less than 1, i is either 2 or 3, j is either 0, 1 or 2, k is 2 or 3, m is either 1, 2 or 3, and r is an integer. Other preferred oxides are defined by the formula

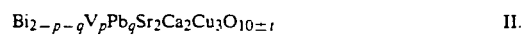

where p and q independently range up to about 0.7 and t is from 0 to less than 1.

11 Claims, 36 Drawing Sheets

X-ray spectra analysis for sample number 12, batch J specified in table 2.

Critical current density $J_c$ as a function of $T_c$ (R=0), based on the preparation methods described for formula II samples, showing an optimal logarithmetic dependence.

VANADIUM-BASED SUPERCONDUCTING METALLIC OXIDES

This is a continuation-in-part of identically titled application Ser. No. 421,015 filed Oct. 13, 1989 abandoned.

BACKGROUND OF THE INVENTION

1. Field of the Invention

The present invention is broadly concerned with new superconducting metallic oxides exhibiting high $T_c$ values on the order of 100° K. and above, coupled with very high calculated $J_c$ critical current values of at least about $10^4$ amperes/cm$^2$. More particularly, in one aspect the invention is concerned with such oxides defined by the general formula:

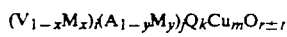  I.

where M is respectively taken from the group consisting of bismuth, lead or antimony, A is calcium, sodium or potassium, Q is different than A and is either strontium, barium or calcium, x and t range between 0 and less than 1, i is either 2 or 3, j is either 0, 1 or 2, k is 2 or 3, m is either 1, 2 or 3, and r is an integer, typically ranging from 8-12. In another aspect, the invention comprehends vanadium-containing oxides of the general formula

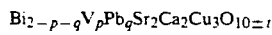  II.

where p and q each independently range up to about 0.7 and t ranges between 0 and less than 1. Superconducting oxides in accordance with the invention exhibit their high $T_c$ and $J_c$ values when the oxides are bulk sintered with an essentially random crystal orientation, so that the oxides are eminently suited for practical applications as high current-carrying conductors.

2. Description of the Prior Art

Superconductivity refers to that special state of a material where its resistance to electrical current flow suddenly and completely disappears when its temperature is lowered. Below this onset or critical temperature $T_c$, a characteristic of the material, the electrical resistance does not merely drop to a low level but it vanishes entirely. Only a very limited list of materials exhibit such a state. The discovery of the first superconductor occurred in 1911. Heike Kammerlingh Onnes discovered that Mercury lost all detectable resistance at a temperature just 4° above absolute zero.

A superconductor also exhibits perfect diamagnetism below its critical temperature, i.e., it expels all magnetic field lines from its interior by producing an opposing magnetic field from a current flowing on its surface. As a consequence of the perfect diamagnetism of superconductors, they can be used to produce magnetic levitation as envisioned in high speed transport systems of the future, where magnetic repulsion is used to counter gravity. The perfect diamagnetism property of superconductors is called the Meissner effect after its discoverer.

Superconductivity is the only large scale quantum phenomenon involving charges found in solid materials. The current-carrying electrons in the superconductor behave as if they were part of a monumentally large single molecule the size of the entire specimen of the material. The macroscopic quantum nature of superconductors makes them useful in measuring magnetic field quantities to high precision or facilitates the measurement of such quantities so small as to be heretofore unmeasurable.

Hence, all three aspects of superconductors give promise of exciting new technologies or improvements in old technologies. However despite the tremendous potential of superconductors, formidable technical problems must be overcome if such materials are to achieve practical commercial application. For example, until very recently, all known superconducting materials attained their superconducting state only at very low (cryogenic) temperatures on the order of 4°-20° K. Such low temperatures had to be reached by evaporating liquid helium, the only substance that remains liquid down to temperatures approaching absolute zero. The few sources of helium in nature and its expensive processing make it a very costly cryogenic fluid.

In recent years, a plethora of new superconducting oxides have been announced by researchers around the world. While these new materials have relatively high critical temperatures on the order of 80°-130° K., they are plagued by a number of intractable problems. For example, certain of these prior materials, while they have high $T_c$ values, have very low (e.g., 1 ampere/cm$^2$ current density values, particularly when the materials are bulk sintered and therefore have random crystal orientation therein. Such prior materials may exhibit higher current densities, but only when formed as oriented epitaxal films on substrates. Obviously, such materials, while they exhibit superconducting properties, are totally impractical for use in most commercial applications. Finally, many of these prior superconductors are extremely brittle and frangible, which again effectively precludes their use as commercial-scale electrical conductors for example.

Accordingly, while there is recent intense interest in superconducting materials, presently available oxides of this character have one or more serious deficiencies which render them useless in commercial applications.

Certain vanadium-containing oxides are described in Che et al., *Journal of Materials Science*, 24, p. 1725-1728, May, 1989. The authors of this article disclose that vanadium, when substituted into bismuth precursors, generally depresses $T_c$ values, and that no superconductivity obtains when the substitution exceeds 0.5. In FIG. 4 of this article, a maximum $T_c$ of slightly over 80° K. is described for a vanadium-containing oxide.

The vanadium oxide needed in this article is V$_2$O$_5$ (Vanadium pentoxide). According to the chemical composition formulae I and II in the article, vandium is substituted for trivalent bismuth. Thus it is highly possible that the negative results obtained in this article were entirely due to using a less advantageous vanadium oxide in the preparation, together with improper heating and sintering conditions.

SUMMARY OF THE INVENTION

The present invention overcomes some of the problems outlined above and provides practical superconducting metallic oxides characterized by high critical temperature levels of at least about 70° K., together with higher critical current densities on the order of 10$^4$ amperes/cm$^2$ or greater. Furthermore, the superconductors hereof are significantly more ductile than previous high $T_c$ oxides, so that the materials of the invention can be readily worked into elongated conductors or other useful shapes.

Broadly speaking, in one aspect of the invention the superconducting materials of the invention have predominately an orthorhombic crystalline structure and are defined by the general formula:

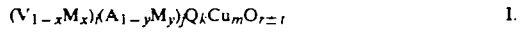

$$(V_{1-x}M_x)_i(A_{1-y}M_y)_jQ_kCu_mO_{r\pm t} \qquad I.$$

where M is respectively selected from the group consisting of bismuth, lead and antimony, A is selected from the group consisting of calcium, sodium and potassium, Q is different than A and is selected from the group consisting of strontium, barium and calcium, x and t are individual numbers each respectively ranging from 0 to less than 1, i is either 2 or 3, j is either 0, 1 or 2, k is 2 or 3, m is either 1, 2 or 3, and r is an integer. As those skilled in the art will appreciate, the subscript "x" in the foregoing formula is indicative of doped oxides when x is larger than zero; where x is zero, the "M" term drops out, leaving only vanadium. Therefore, while the x term is variable, preferably it ranges from about 0–0.90, and most preferably from about 0.55 to 0.90. Similarly, r is generally an integer ranging from about 8–12, and the ± t term recognizes that the degree of oxidation may vary slightly from whole integer values: this latter term is generally understood to exist in all oxides of the invention and ranges from about 0–0.2, but is not normally set forth in specific chemical formulae.

In preferred forms, the above-defined superconducting materials of the invention are bulk sintered and essentially self-sustaining and substrate free, and accordingly exhibit a random crystal orientation. Furthermore, the materials exhibit a generally linear decreasing electrical resistivity as the temperature thereof is lowered from about 200° K. (more preferably 300° K.) down to about the critical temperature thereof. Such a property in bulk sintered superconducting oxides of random crystal orientation is predictive of a large charge carrier density for the materials and could provide a critical current value of $10^4$ amperes/cm$^2$ or more.

Although metallic oxides contemplated by the invention may have a $T_c$ value as low as about 70° K. and still be useful, preferably the oxides hereof should have a $T_c$ of above about 100° K., and most preferably from about 110°–150° K.

Representative oxides in accordance with the invention include $(V_{1-x}Bi_x)_2CaSr_2Cu_2O_8$ wherein x is about 0.90. Accordingly, the oxide is properly characterized insofar as its crystalline structure is concerned by the accepted shorthand notation "2122", which refers in order to the stoichiometric subscripts i, j, k, m of the above general formula.

$$V_2(Na_{1-y}Bi_y)Sr_2Cu_2O_8 \qquad I$$

where y is about 0.2.

Another such oxide would be $V_2NaSr_2Cu_2O_8$. Accordingly, this compound is likewise characterized as a 2122 oxide, wherein x is zero. Another preferred oxide would be $V_2(Na_{1-y}Bi_y)_2Sr_2Cu_3O_{10}$ where y is again about 0.2, which would of course be a 2223 oxide, with x again being zero.

In another aspect of the invention, superconductivity oxides of the general formula

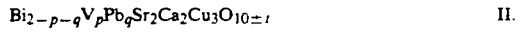

$$Bi_{2-p-q}V_pPb_qSr_2Ca_2Cu_3O_{10\pm t} \qquad II.$$

have been discovered, wherein p and q independently range up to about 0.7, and more preferably from about 0.05 to 0.7, whereas t ranges from 0 to less than 1.

DESCRIPTION OF THE PREFERRED EMBODIMENTS

Figure 1:
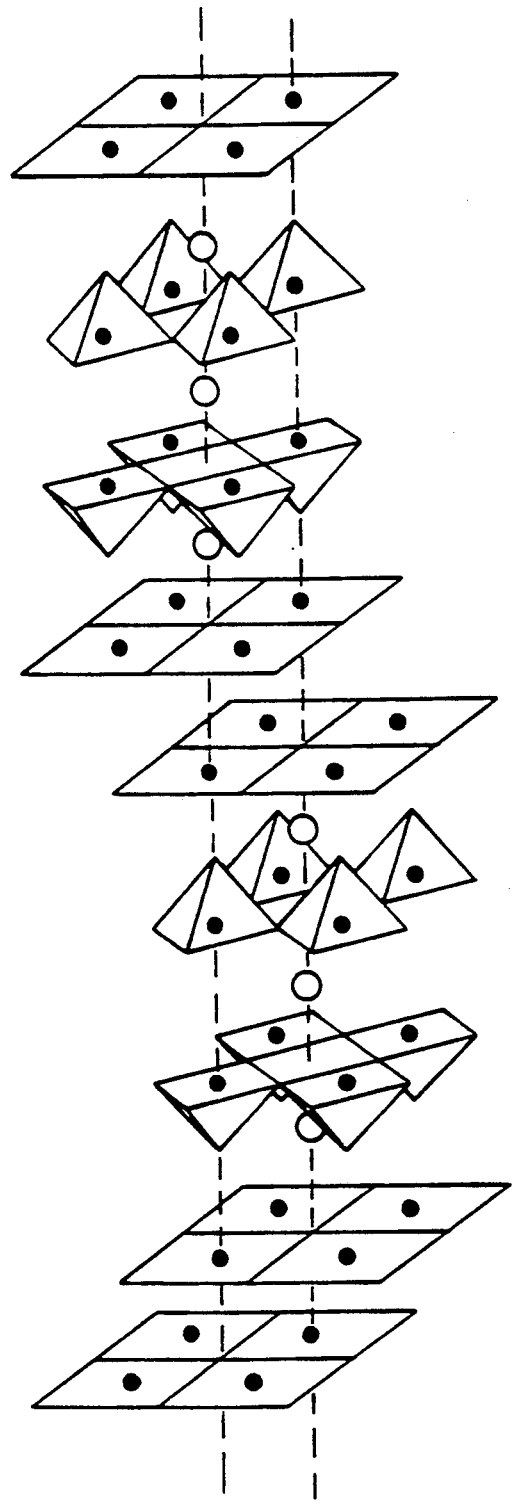
FIG. 1 is a schematic representation of the crystalline structure of one class of superconducting oxides in accordance with the Formula I oxides of the invention, namely the 2122 oxides.

Analysis of the superconducting oxides of the present invention indicate that they are all consistent with the theory of simultaneous excitonic-superconductivity condensation, also known as the excitonic enhancement model (EEM). Although the inventors do not wish to be bound by any particular theory or explanation of the superconductivity properties of the oxides of the invention, the EEM theory appears to consistently explain the observed and calculated phenomena.

The basic EEM theory postulates that a high $T_c$ material must have a semiconductor-like or a semi-metal-like band structure. Intrinsic hole population must exist at the top of the valence band (VB) which is separated from the conduction band (CB) by a gap. The normal conductivity is then carried by holes with its Fermi surface in VB.

Secondly, the theory requires that electrons excited to the CB form excitons with the holes in the VB via strong Coulomb attraction. These excitons are not charge neutral because of the condensed long-range-ordering and the presence of intrinsic hole states in the VB. The condition for excitonic bonding depends on the size of the band gap G (or band overlap for semimetal), the static dielectric constant $\epsilon_o$ and the reduced effective mass tensor of the electrons and holes. For G of the order of 1 eV, $\epsilon_o$ is expected to be of order 10 for a semiconductor. However, for a material with large intrinsic hole population, $\epsilon_o$ can be even smaller because of the larger separation between the Fermi surface and the CB minimum.

Third, the EEM theory specifies that below the critical temperature $T_c$, a simultaneous excitonic and superconductivity condensation of positively charged excitons is realized. This condensation results in the renormalization of the normal state Fermi surface. In contrast to the normal metallic superconductors in which the Fermi surface is measured from the bottom of CB, the Fermi surface of this new condensation of positively charged quasi-particles must be measured from the top of the VB. This can also be viewed as the off-diagonal-long-range ordering (ODLRO) of charged fields which are linear superpositions of electron and hole states.

Finally, in EEM theory, the positively charged quasi-particles, i.e., charged excitons, are formed by linear combination of CB electrons and VB holes. Such a linear combination breaks charge symmetry and thus gives rise to fractional charge. The "Cooper pairs" formed by these fractionally charged quasi-particles must then give non-integer flux quantization, and slightly reduced Meissner effect. The specific heat on the other hand remains similar to that given by BCS weak coupling theory; except that a shift of the Fermi surface would also accompany this simultaneous breaking of the Cooper and excitonic pairs. Thus a double specific heat jump near $T_c$ is expected.

The EEM Theory is more fully described in two papers published by Wong and Ching, "The Theory of Simultaneous Excitonic-Superconductivity Condensation I and II", appearing in *Physica C*, March, 1989, pages 1–14 and 15–31; such papers are incorporated by reference herein.

The following examples set forth the presently preferred methods of synthesizing superconducting oxides in accordance with the invention. However, nothing in these examples should be deemed a limitation upon the overall scope of the invention.

A. OXIDES IN ACCORDANCE WITH FORMULA I

Example 1:

In this example a 2223 oxide, namely $(V_{0.1}Bi_{0.9})_2Ca_2Sr_2Cu_3O_{r\pm t}$, is synthesized. The degree of oxidation of the material is not fully known, and accordingly generalized $r \pm t$ in notation has been employed.

In any event, the following compounds are provided in appropriate molecular weight proportions in order to achieve the above noted oxide: $CaO, SrO, CuO, Bi_2O_3$ and $V_2O_3$. In the first step, the CaO, one-half of the SrO, and CuO are mixed together and manually ground using an agate mortar and pestle for a period of about ten minutes to achieve an average particle size of about $10^{-4}$ mm. The ground powder is then placed in an aluminum $(Al_2O_3)$ boat and heated in a tube furnace (Mini-Mite 55035 furnace commercialized by the Linberg Co. of Watertown, WI) at 950° C. for forty hours. During this period, pure oxygen is slowly passed through the tube in a stoichiometric excess. After the heating step, the powder is cooled by turning power off to the furnace and allowing the powder to cool to room temperature in the furnace.

The previously heated powder is then mixed with the remaining one-half of the SrO and the bismuth and vanadium oxides and manually ground again for about ten minutes. The mixed powder is then pressed into pellets having a diameter of about 7 mm and a thickness of about 1 mm. The pellets were then heated in the tube furnace at 860° C. in air for about 130 hours. The pellets were then cooled by shutting down power to the furnace and allowing the pellets to cool to room temperature.

Figure 2:
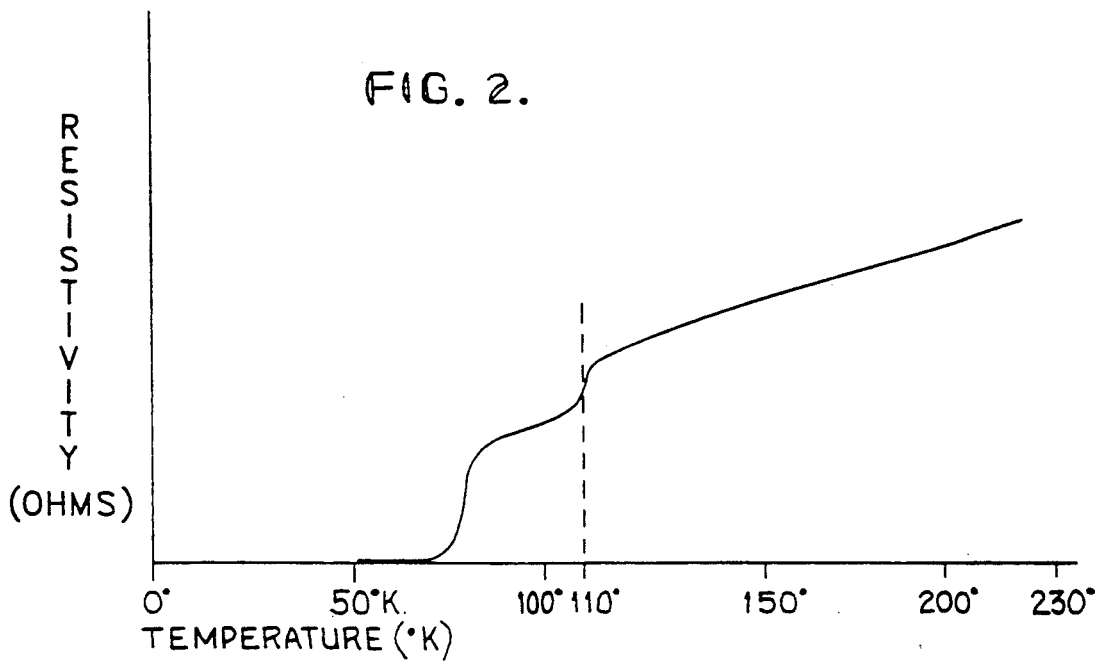
FIG. 2 is a graphical representation of the resistivity characteristics of a superconducting oxide in accordance with Formula I, $(V_{0.10}Bi_{0.90})_2CaSr_2Cu_2O_{r\pm t}$.

The completed pellets were then tested for electrical resistivity and magnetic susceptibility, in order to determine the superconducting characteristics of the oxide. FIG. 2 illustrates the results of the resistivity determination, wherein a current of 1 mA at 27 Hz was imposed across the sample. Specifically, it will be observed that the oxides exhibit an essentially linearly decreasing electrical resistance between about 230° K. and the $T_c$, which is approximately 110° K. As indicated above, such a steep resistivity profile in a bulk sintered bismuth-based oxide having random crystal orientation is in itself novel. Moreover, this is predictive of a critical current value $J_c$ larger than pure bismuth compounds. The generally vertical portion of the graph at about 110° K. does not drop to zero resistivity; this is believed to occur either because the oxide contains a 2122 phase or because of the presence of a pure bismuth superconducting compound in the oxide. The shape of the graph below 110° K. with a nearly vertical decrease in resistivity to about zero at approximately 70°–80° K. indicates that, at this lower temperature, either the 2122 phase or the pure bismuth compound becomes superconducting.

Figure 3:
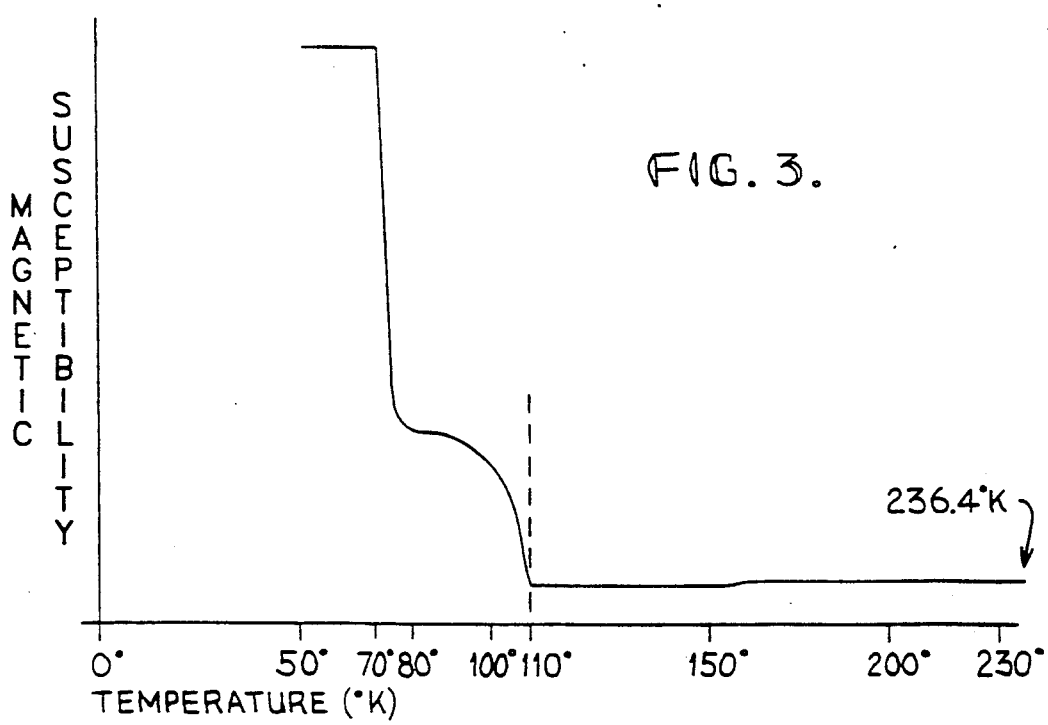
FIG. 3 is a graphical representation of the magnetic susceptibility (Meissner effect) of the oxide referred to in FIG. 2.
Figure 4:
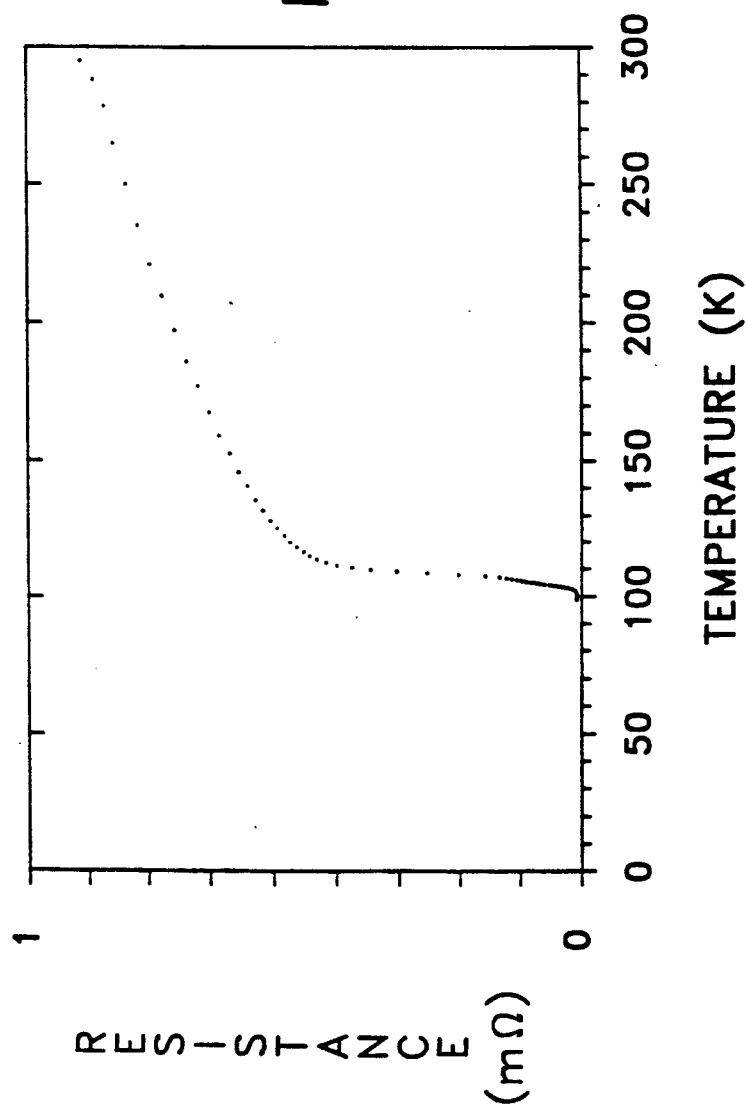
FIGS. 4–33 are graphical representations of the resistivity characteristics of superconducting oxides in accordance with Formula II.
Figure 5:
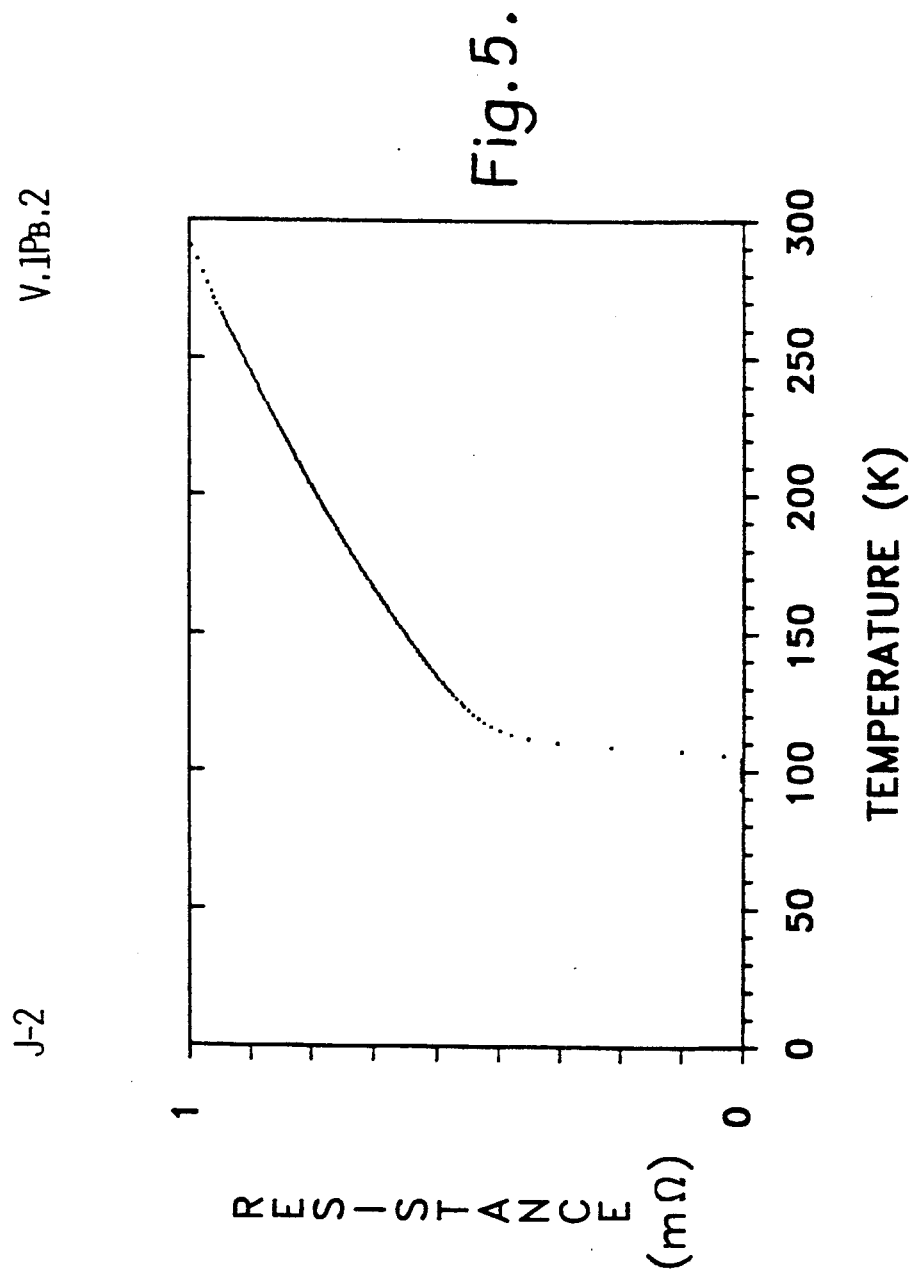
Figure 6:
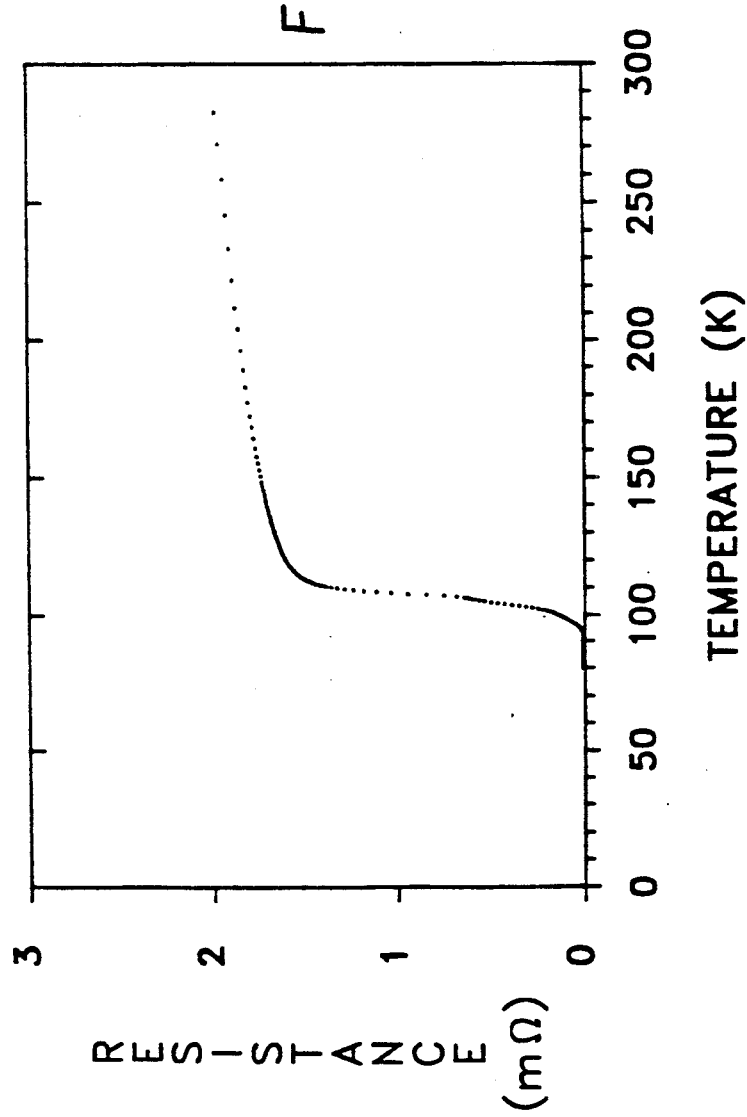
Figure 7:
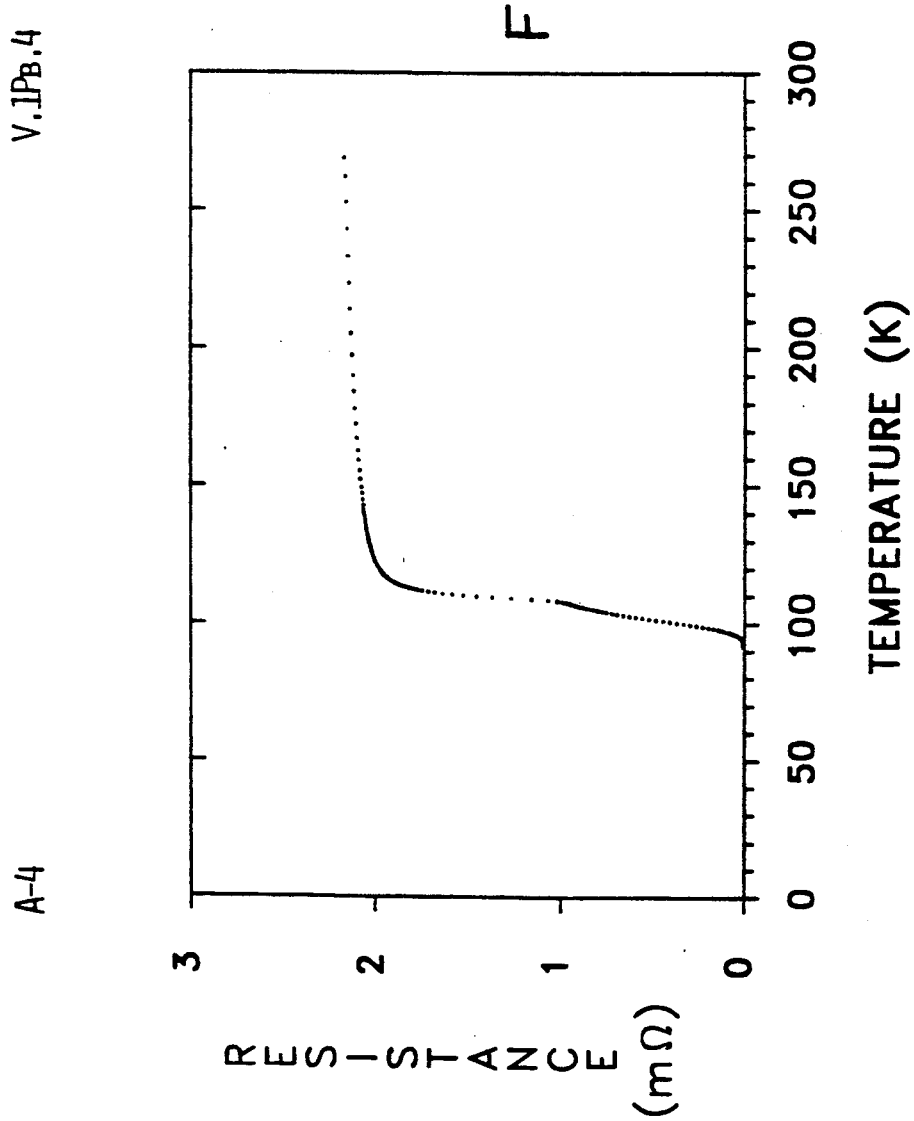
Figure 8:
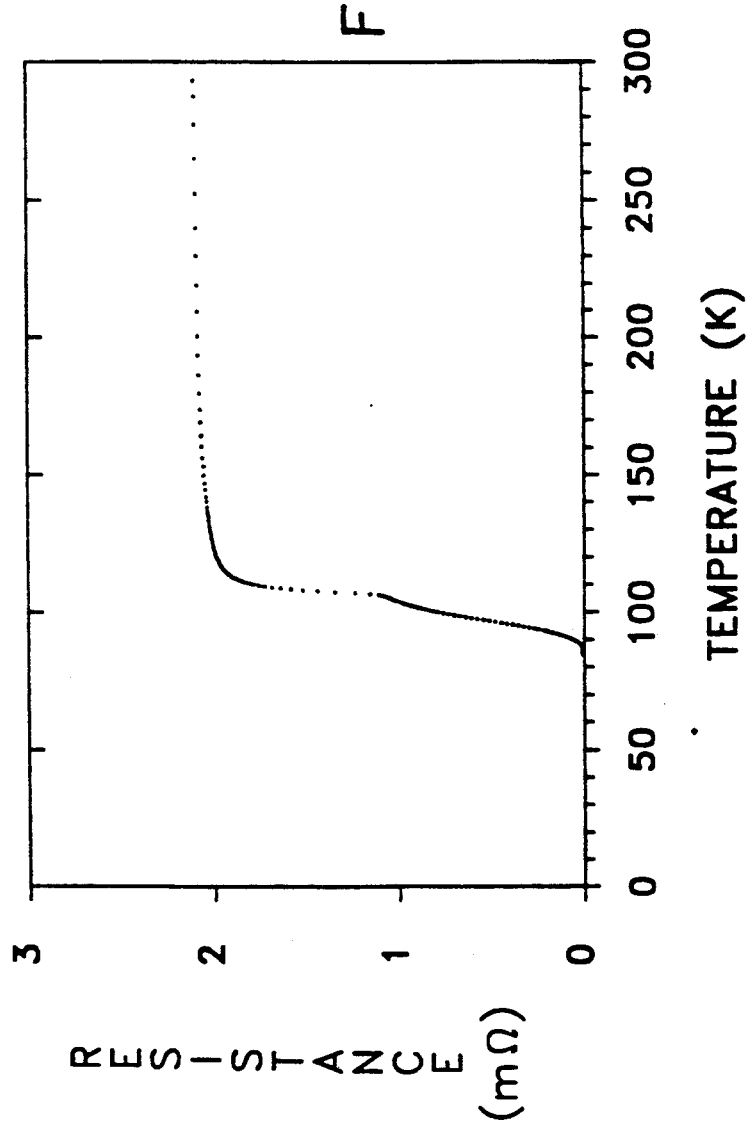
Figure 9:
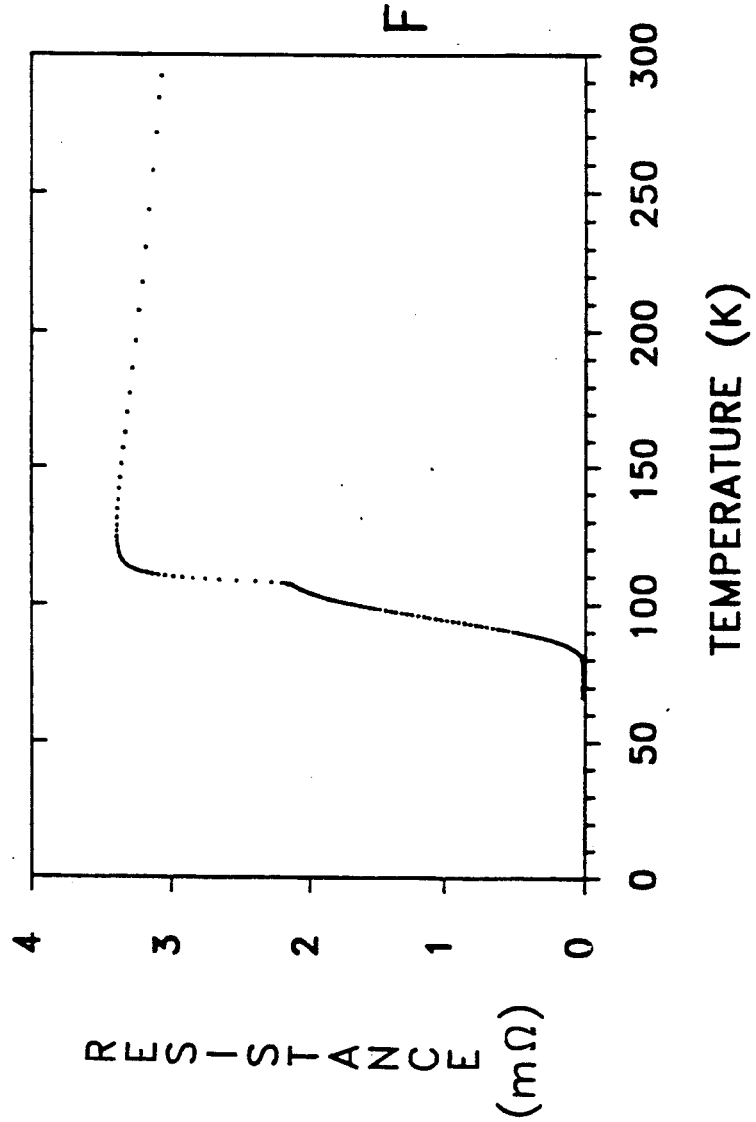
Figure 10:
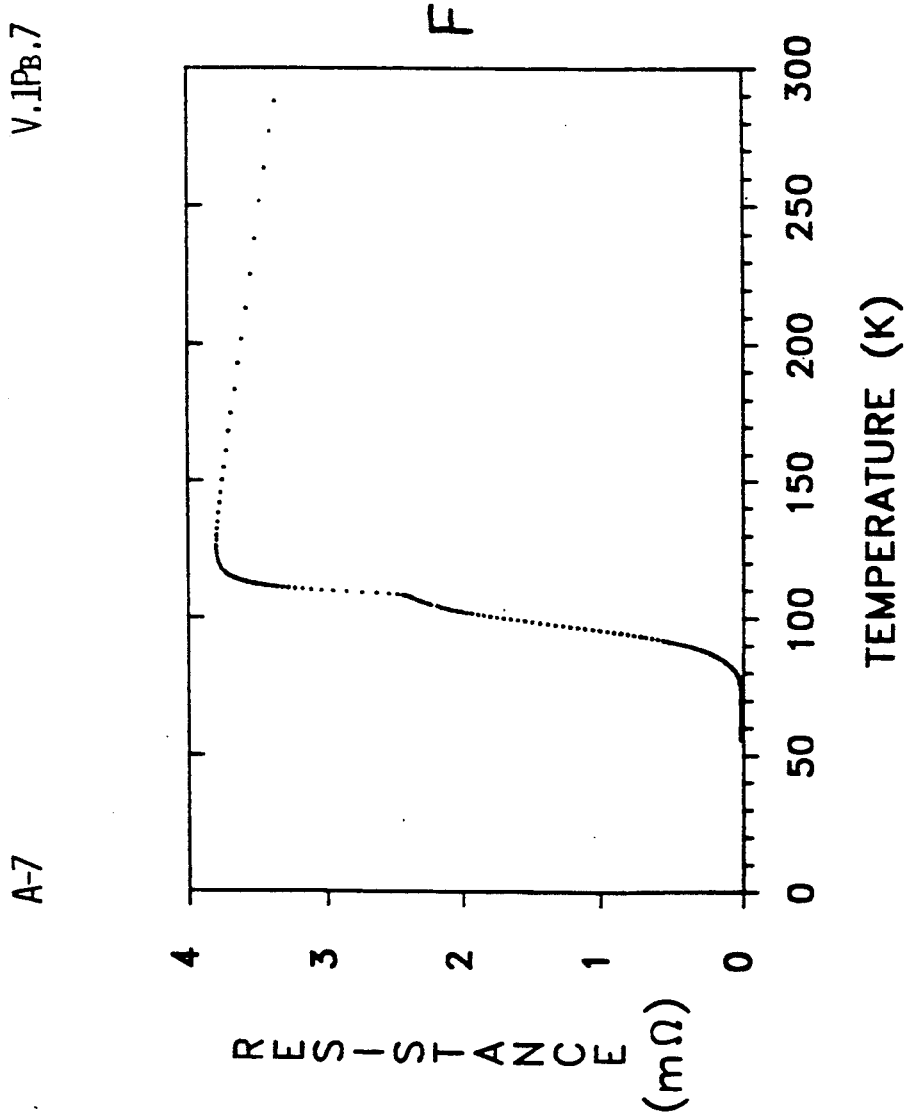
Figure 11:
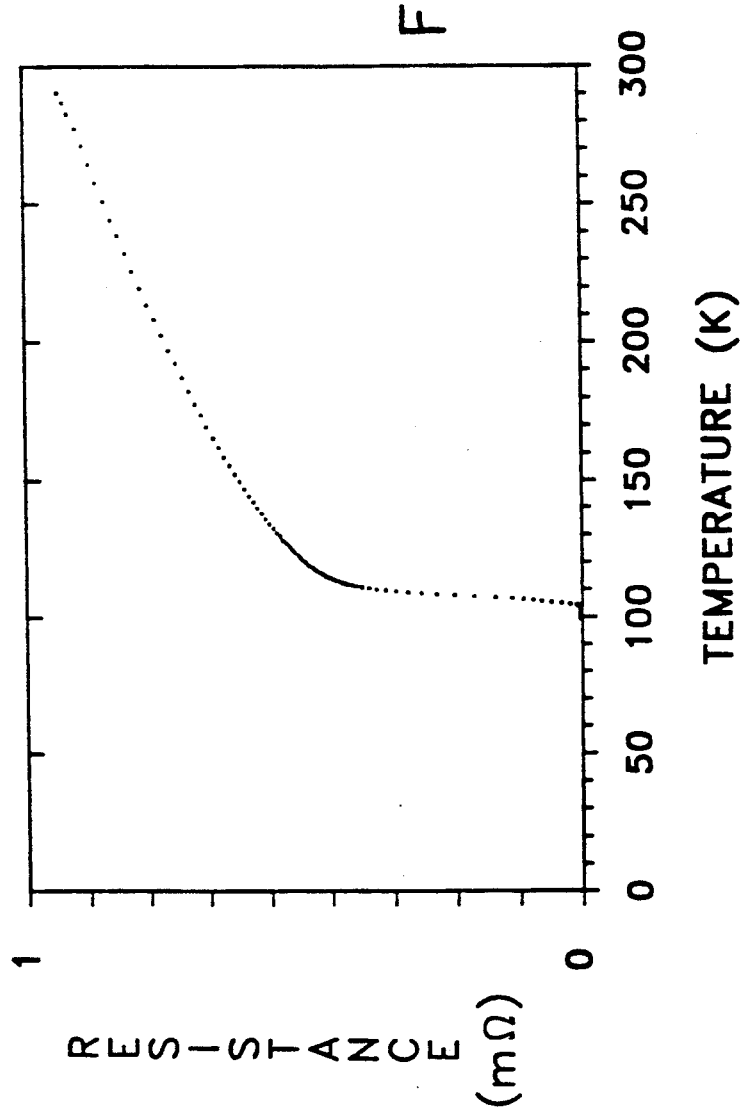
Figure 12:
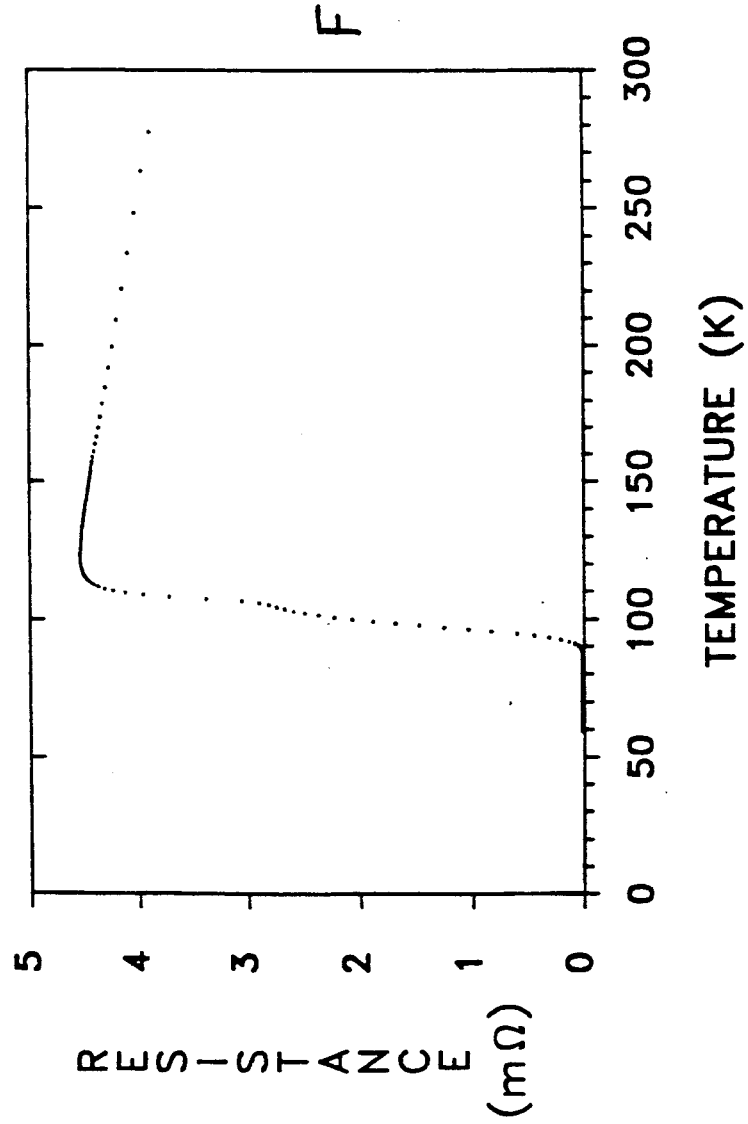
Figure 13:
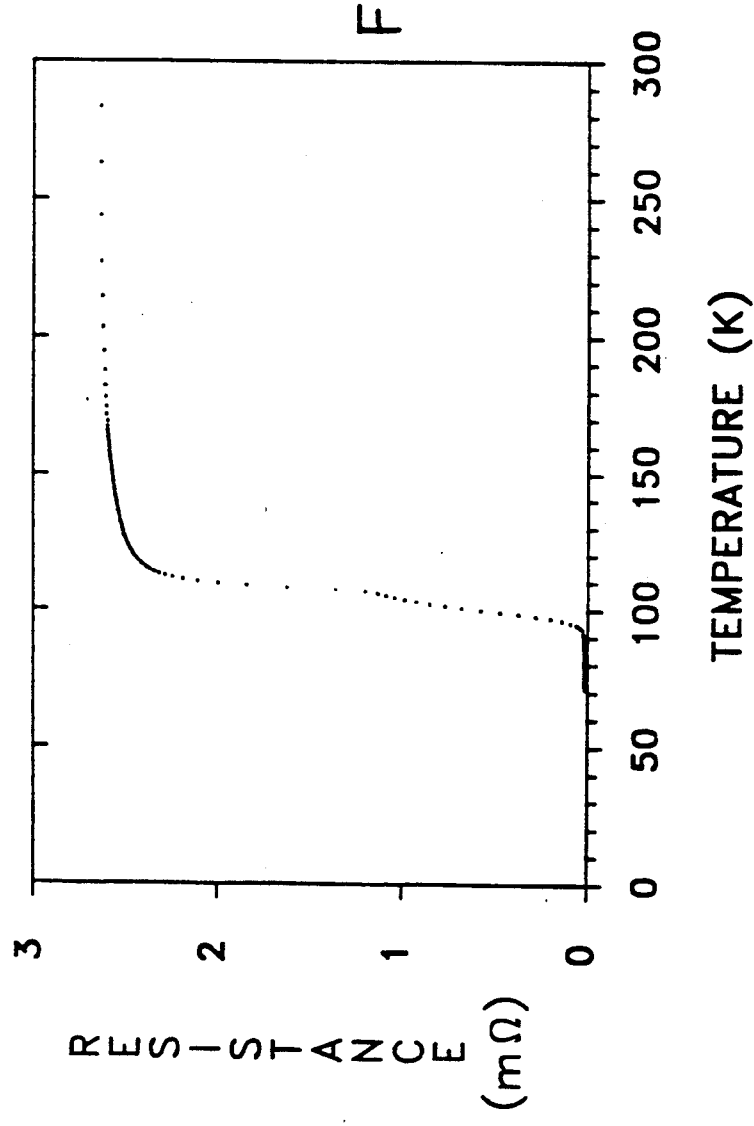
Figure 14:
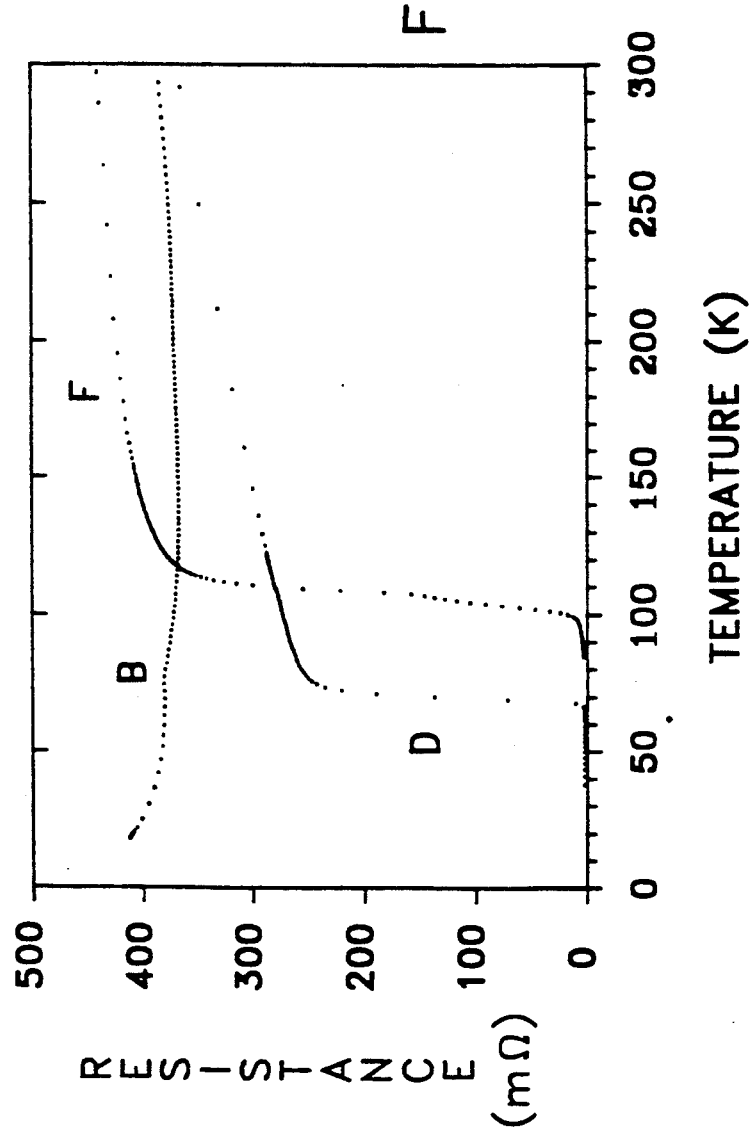
Figure 15:
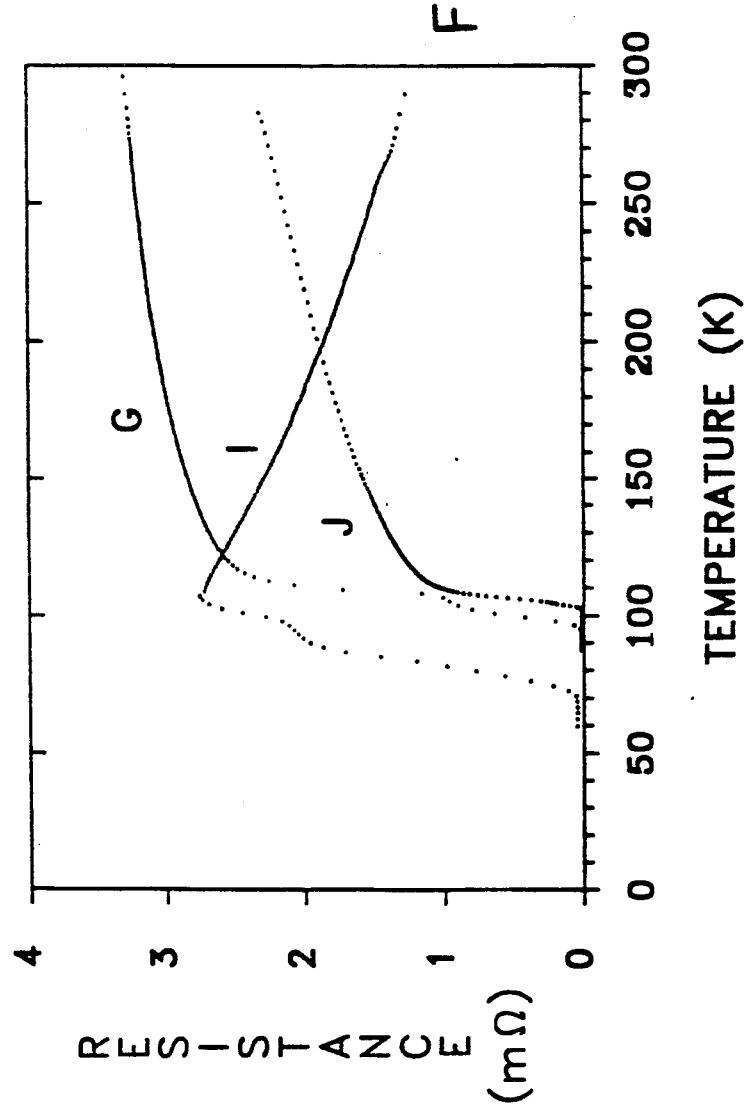
Figure 16:
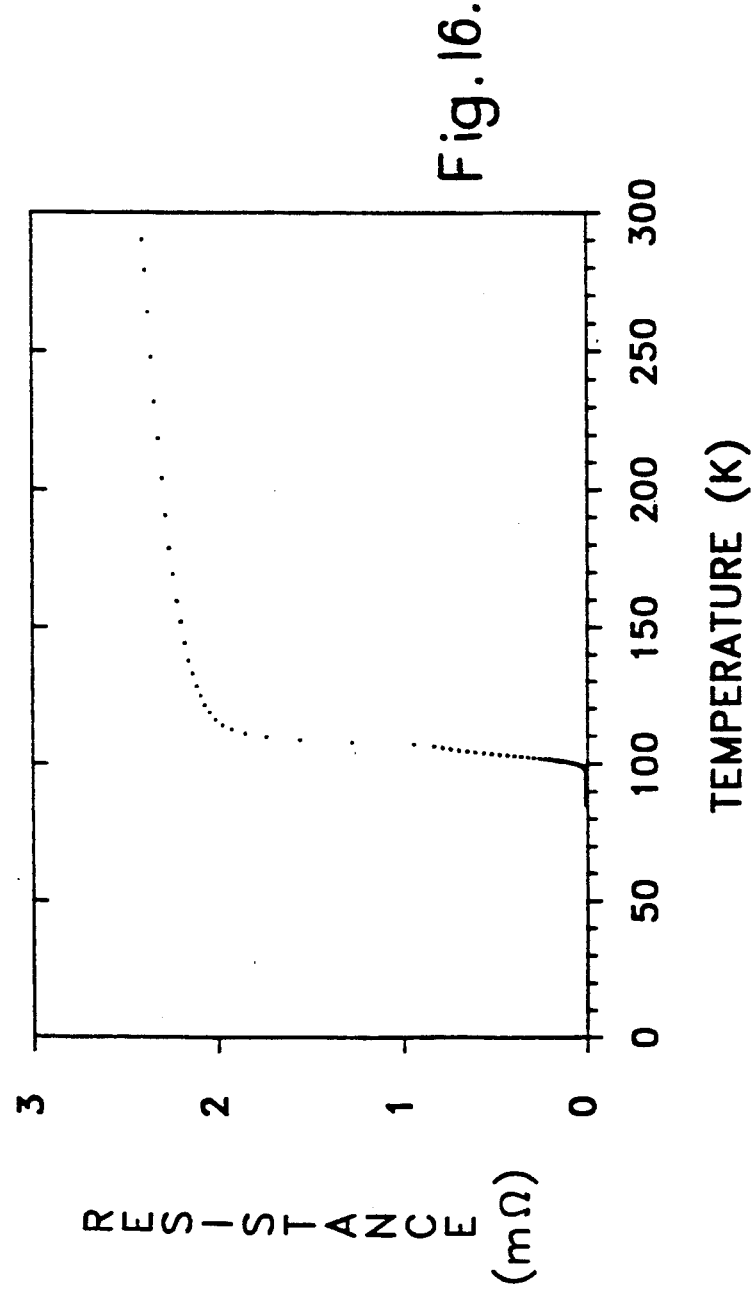
Figure 17:
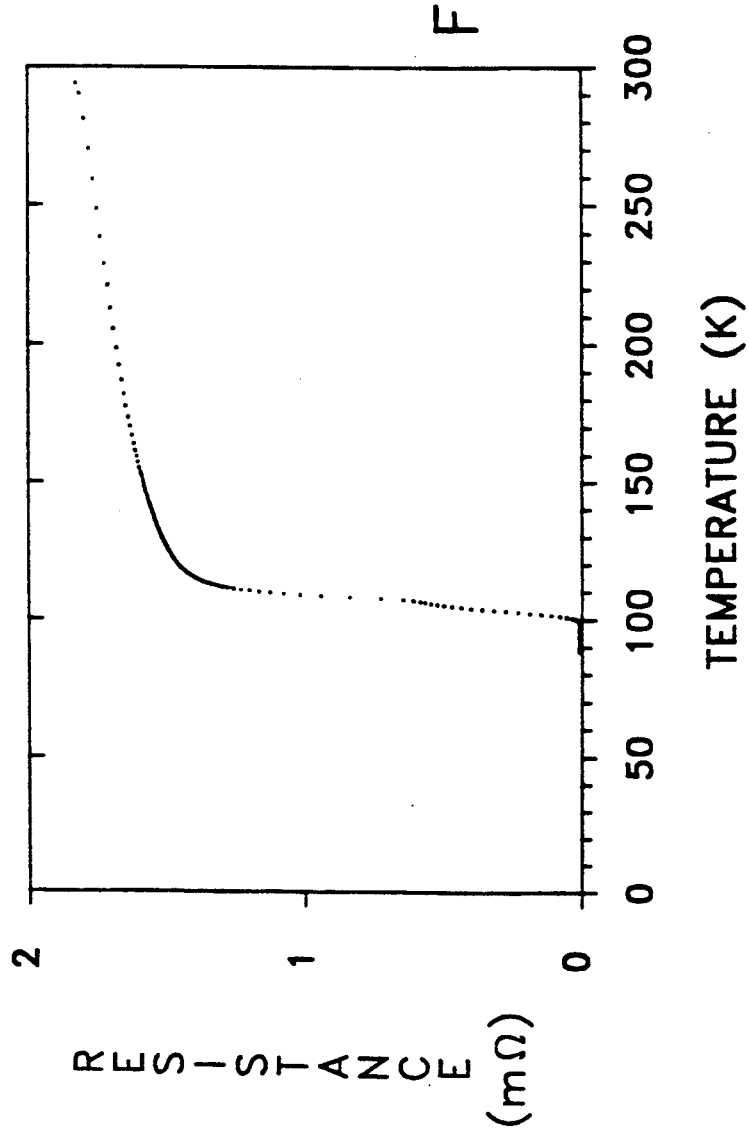
Figure 18:
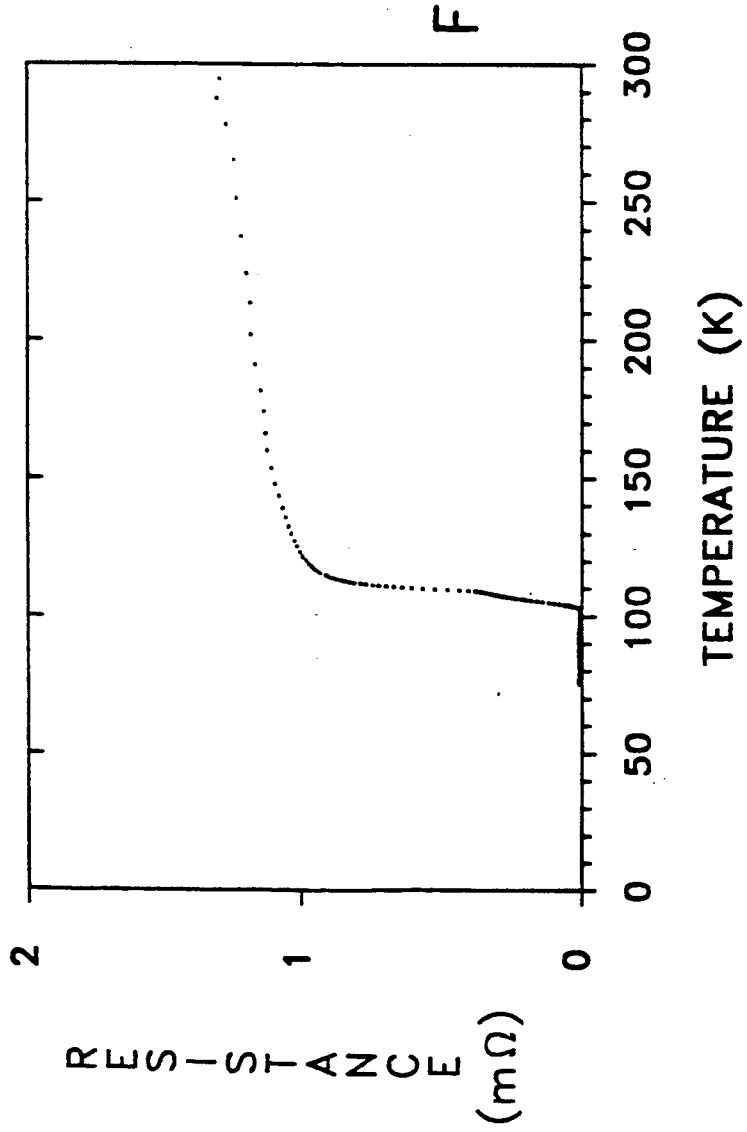
Figure 19:
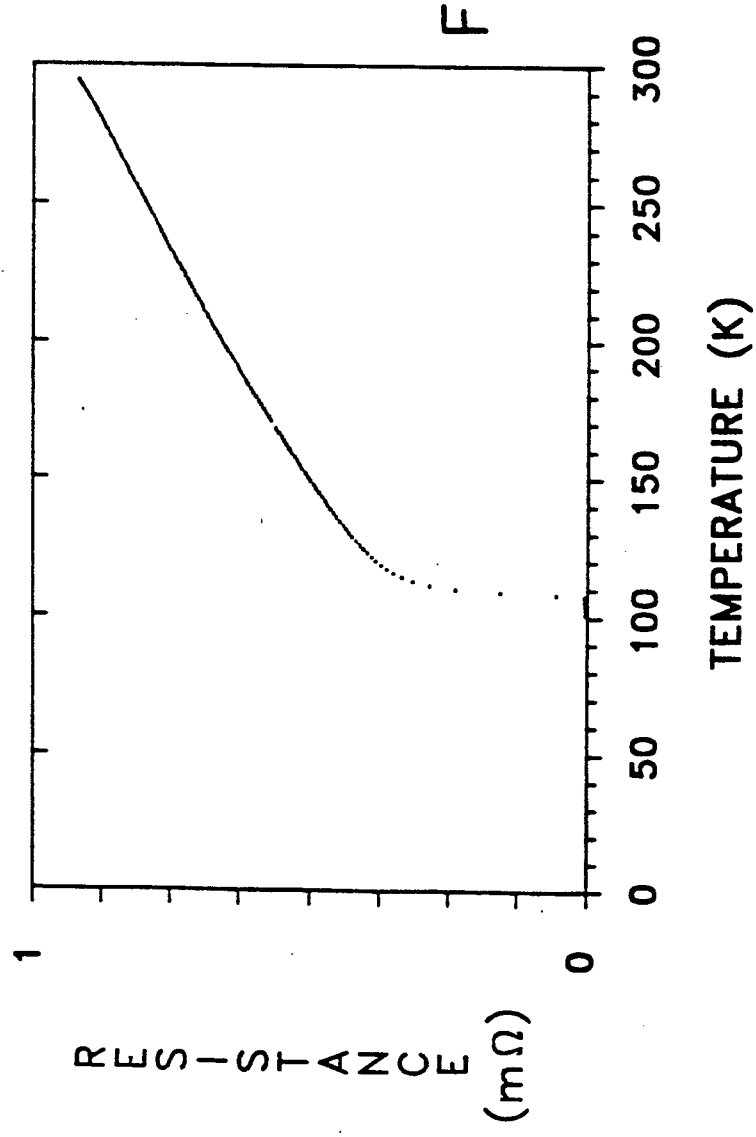
Figure 20:
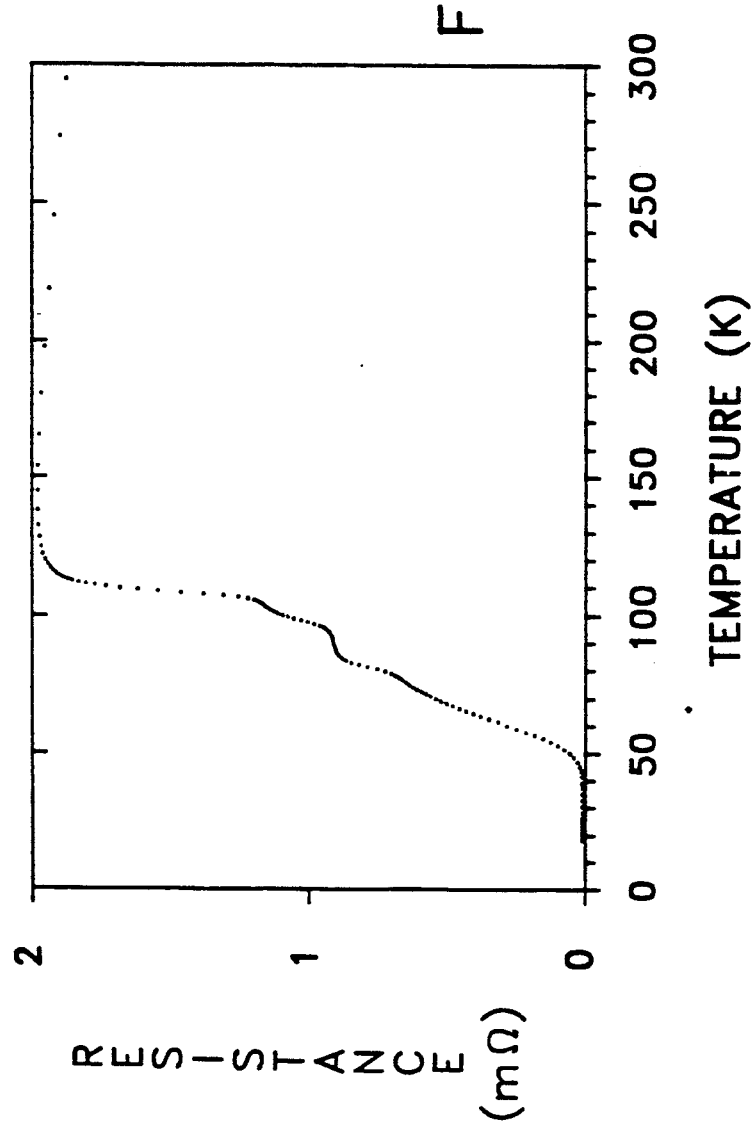
Figure 21:
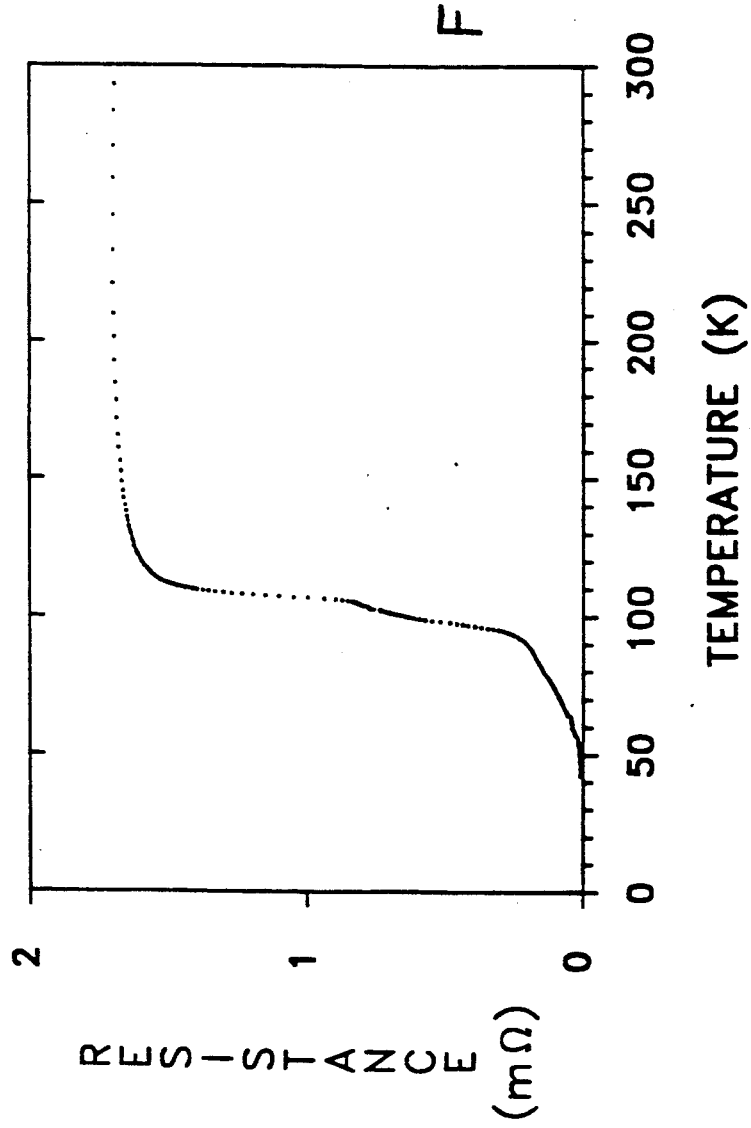
Figure 22:
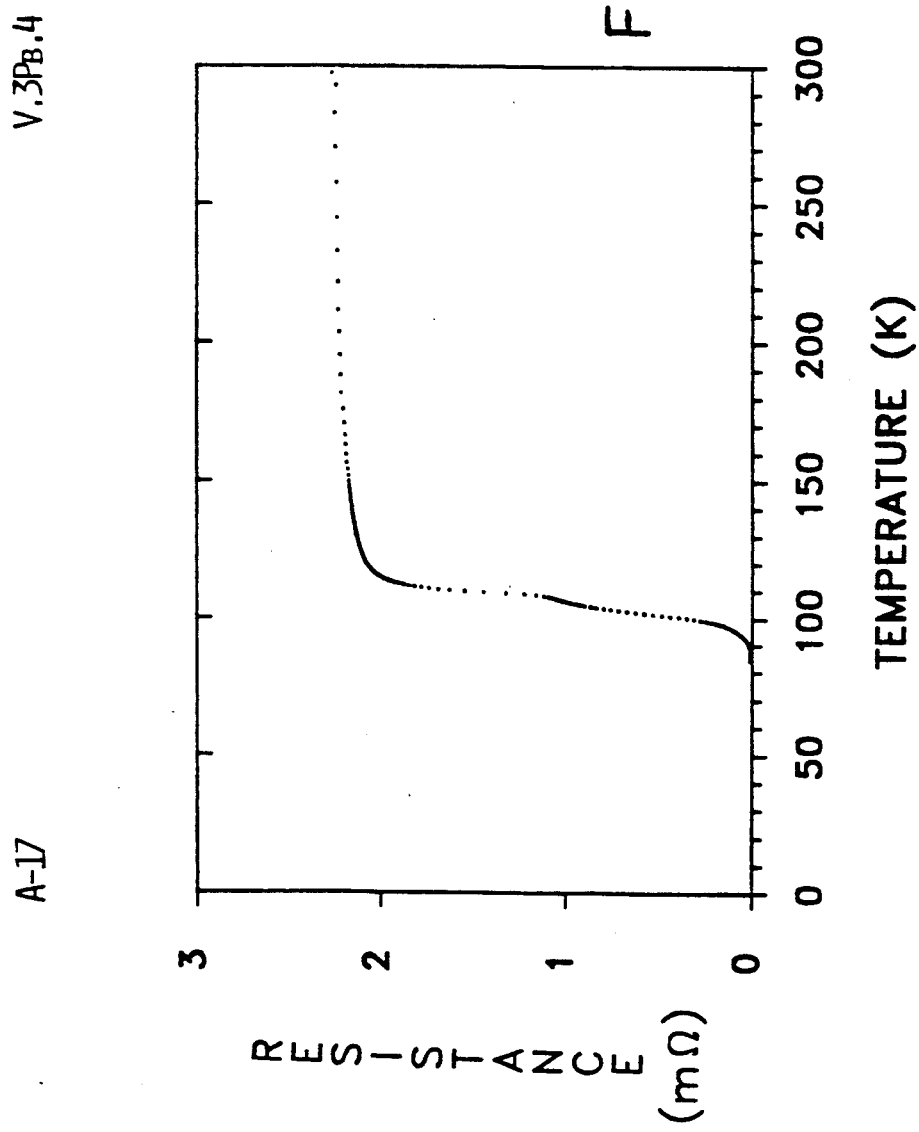
Figure 23:
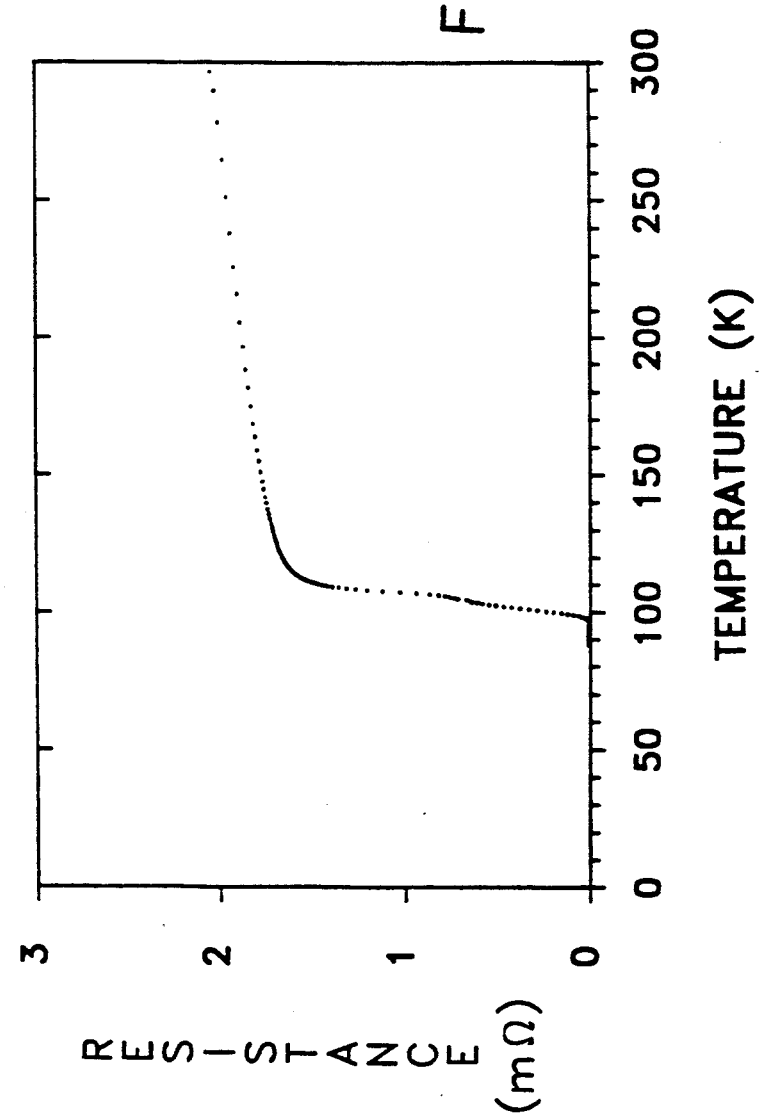
Figure 24:
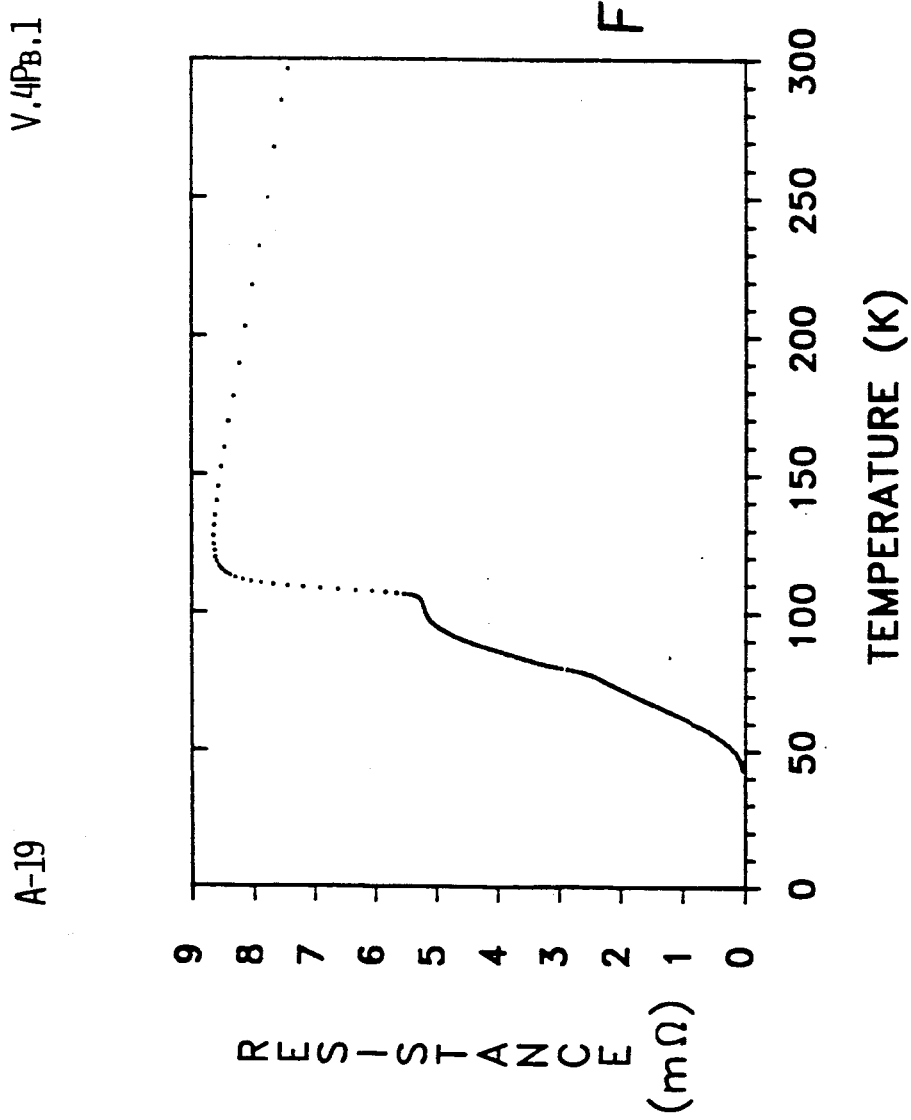
Figure 25:
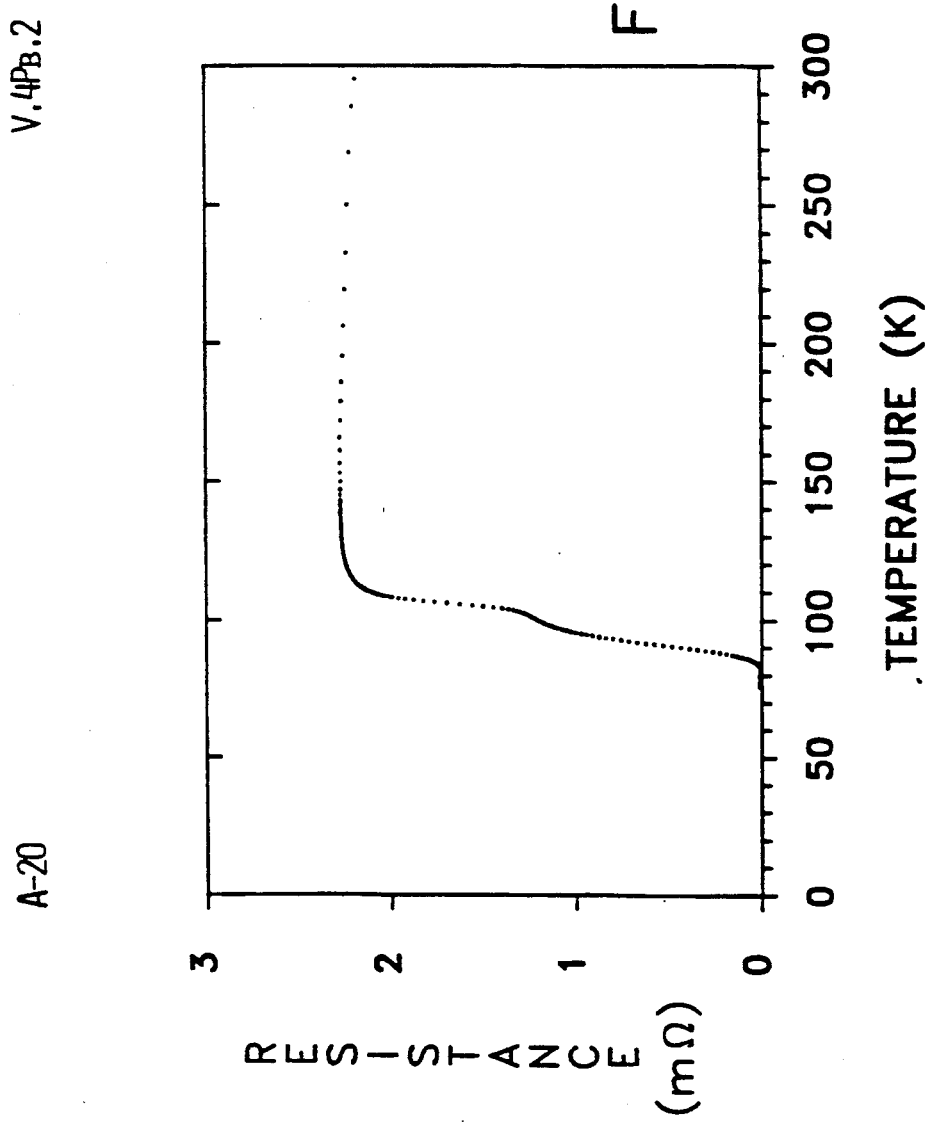
Figure 26:
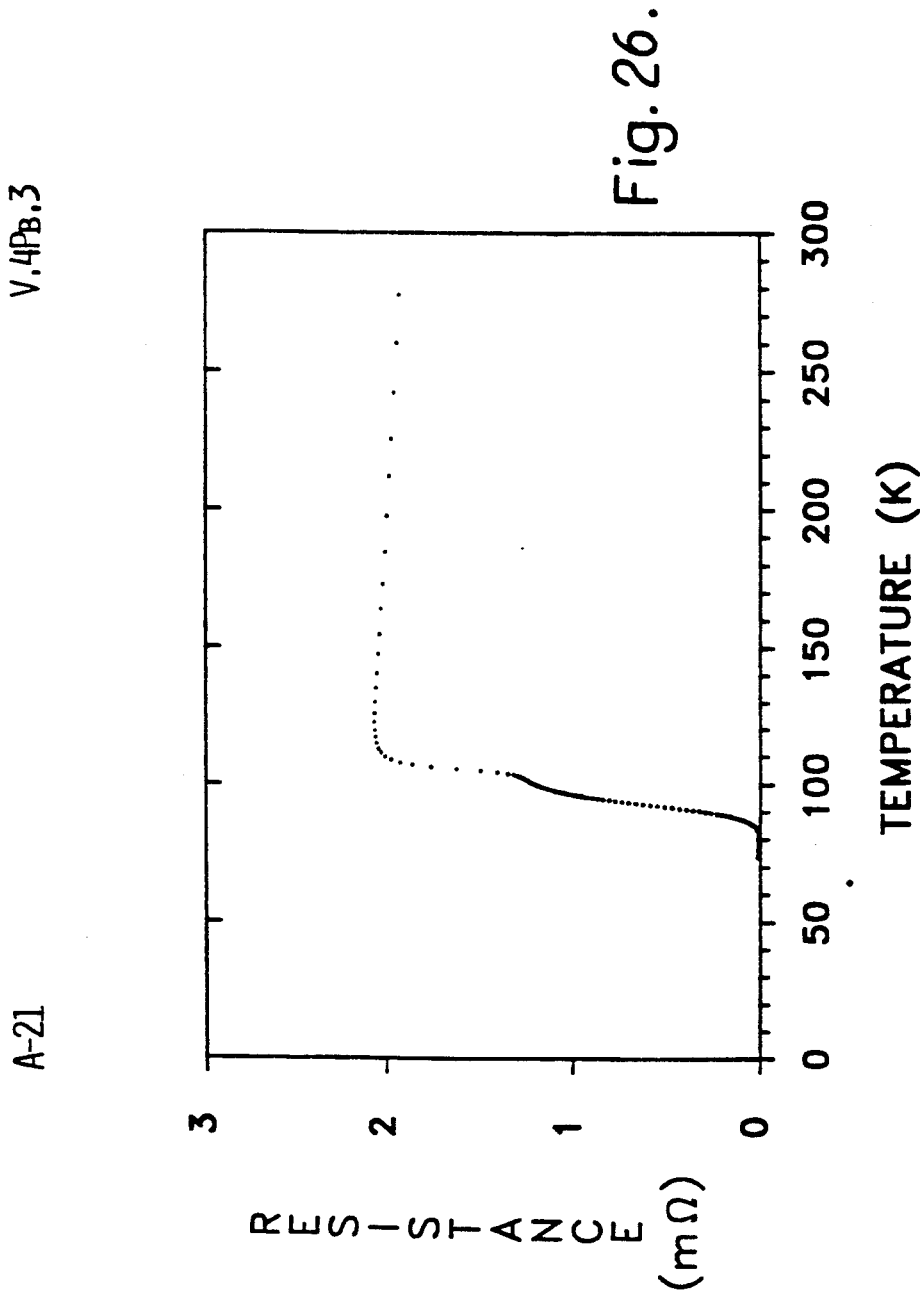
Figure 27:
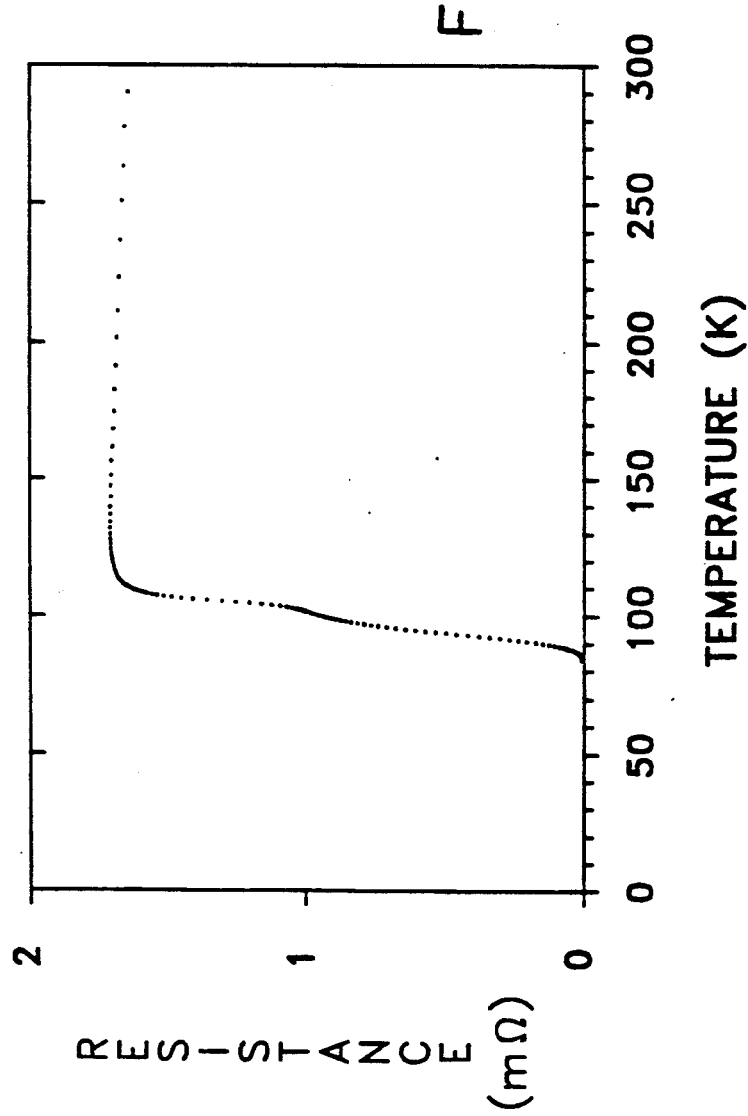
Figure 28:
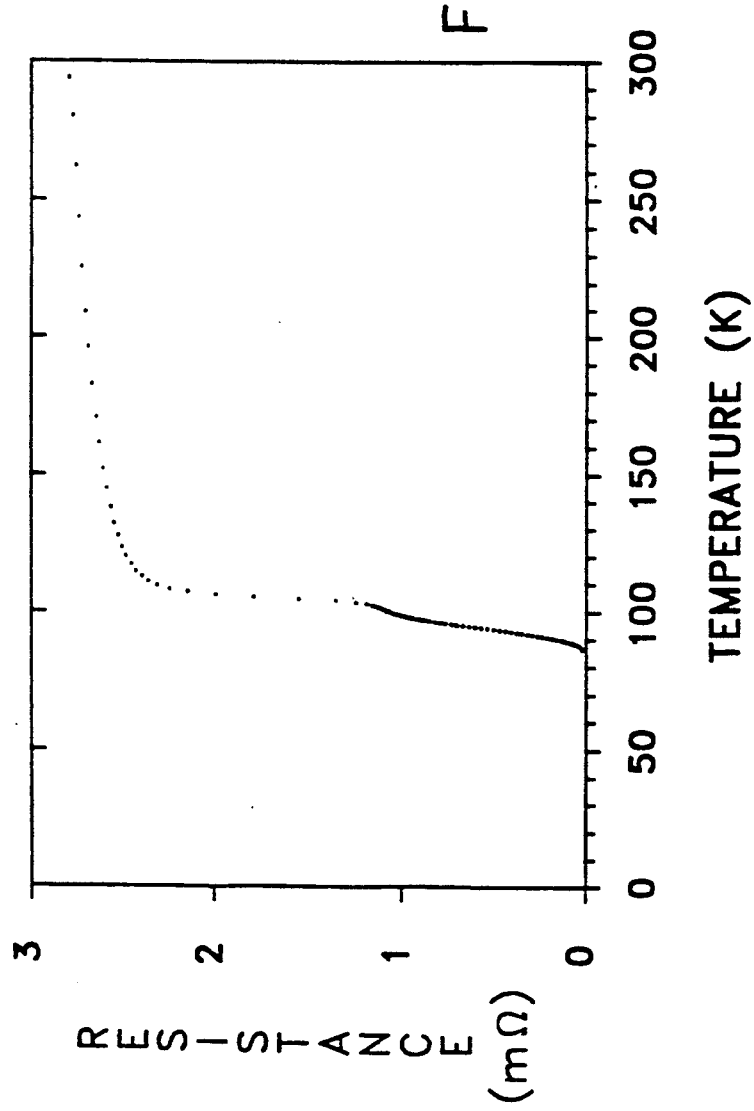
Figure 29:
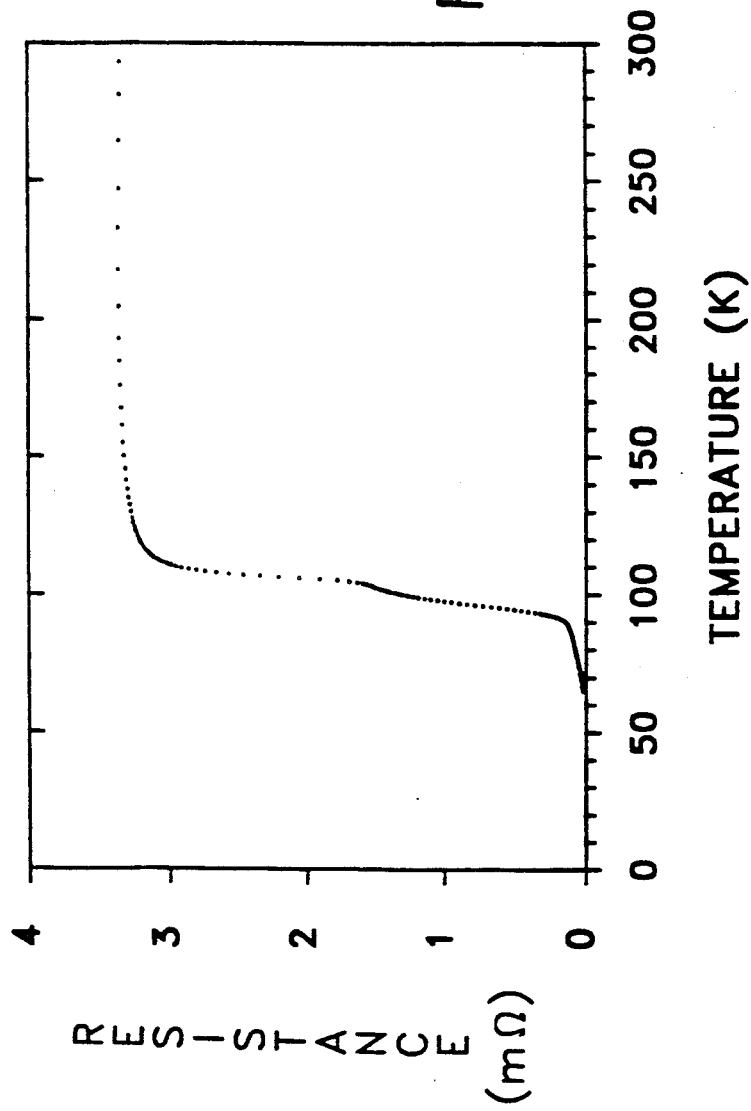
Figure 30:
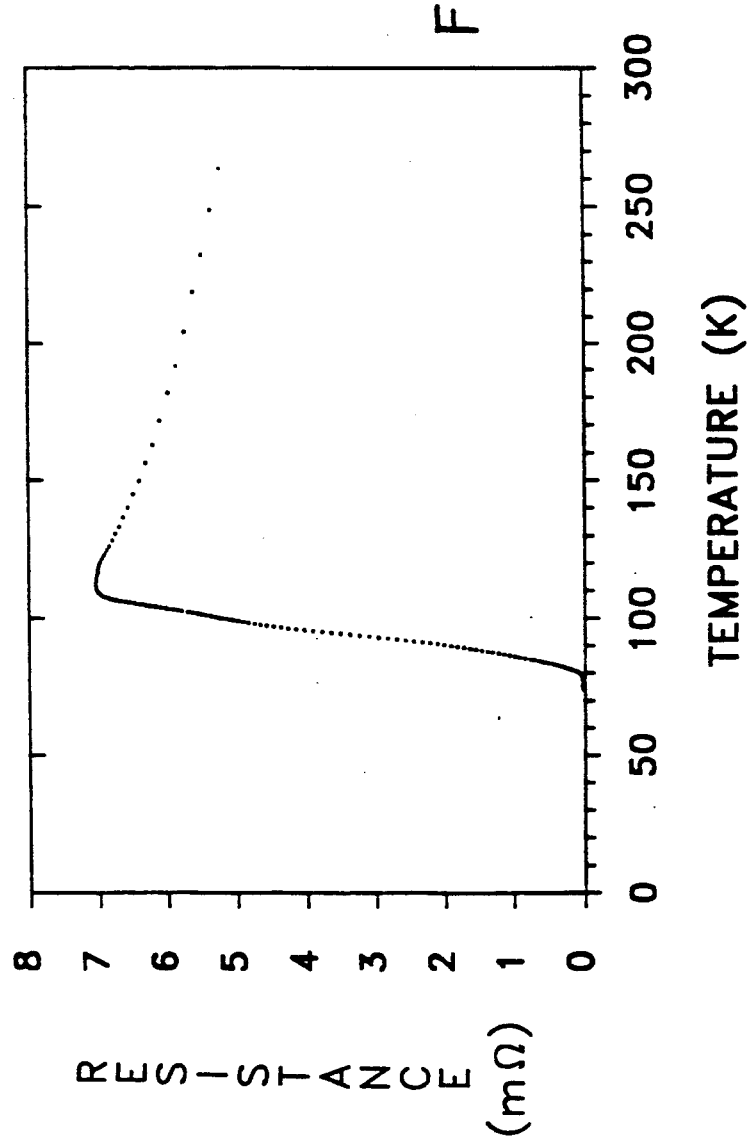
Figure 31:
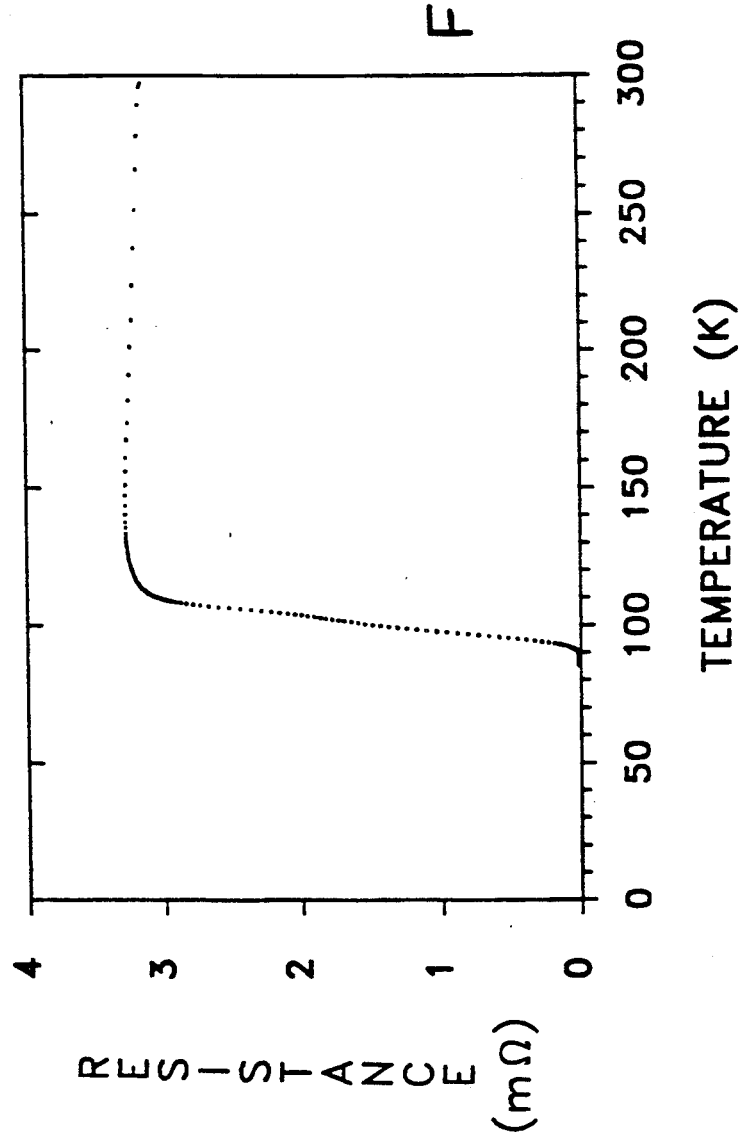
Figure 32:
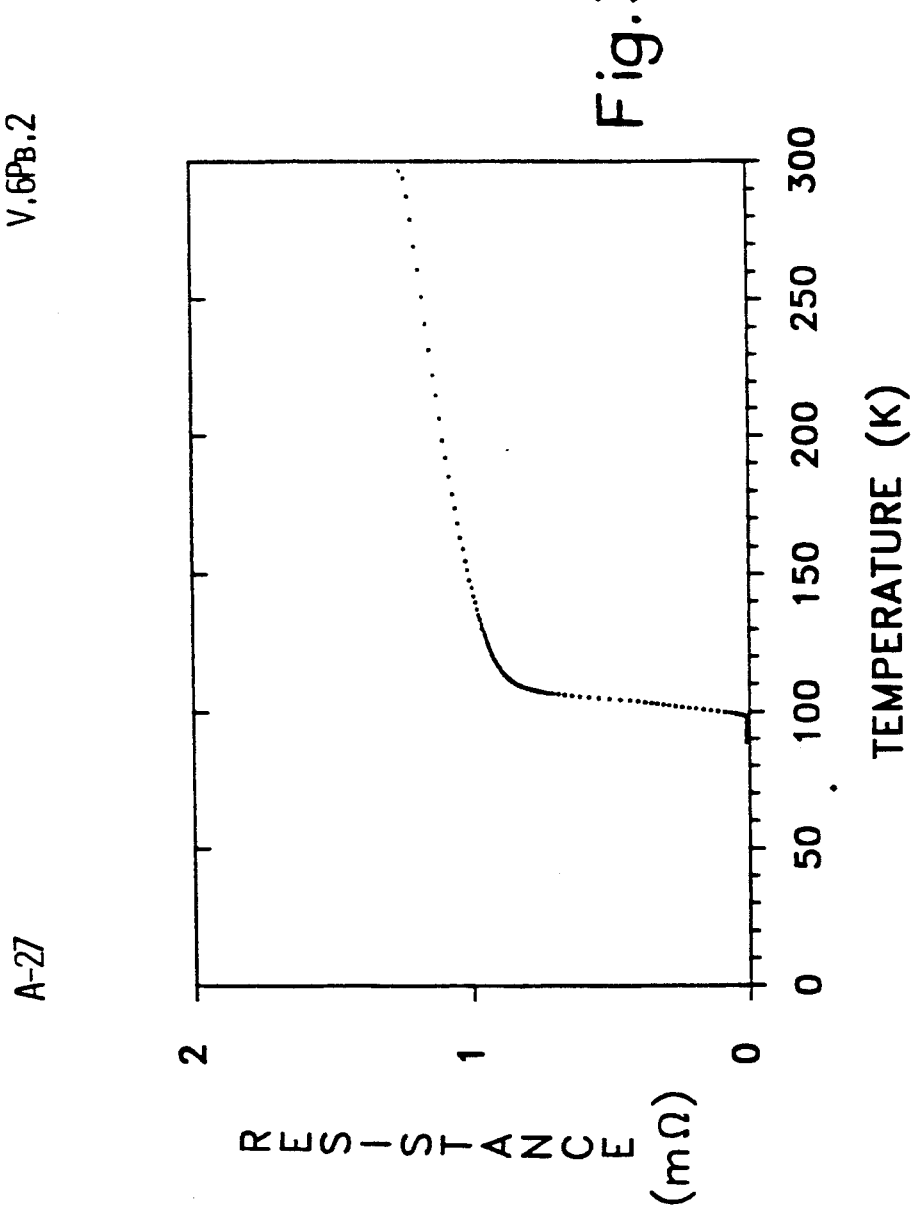
Figure 33:
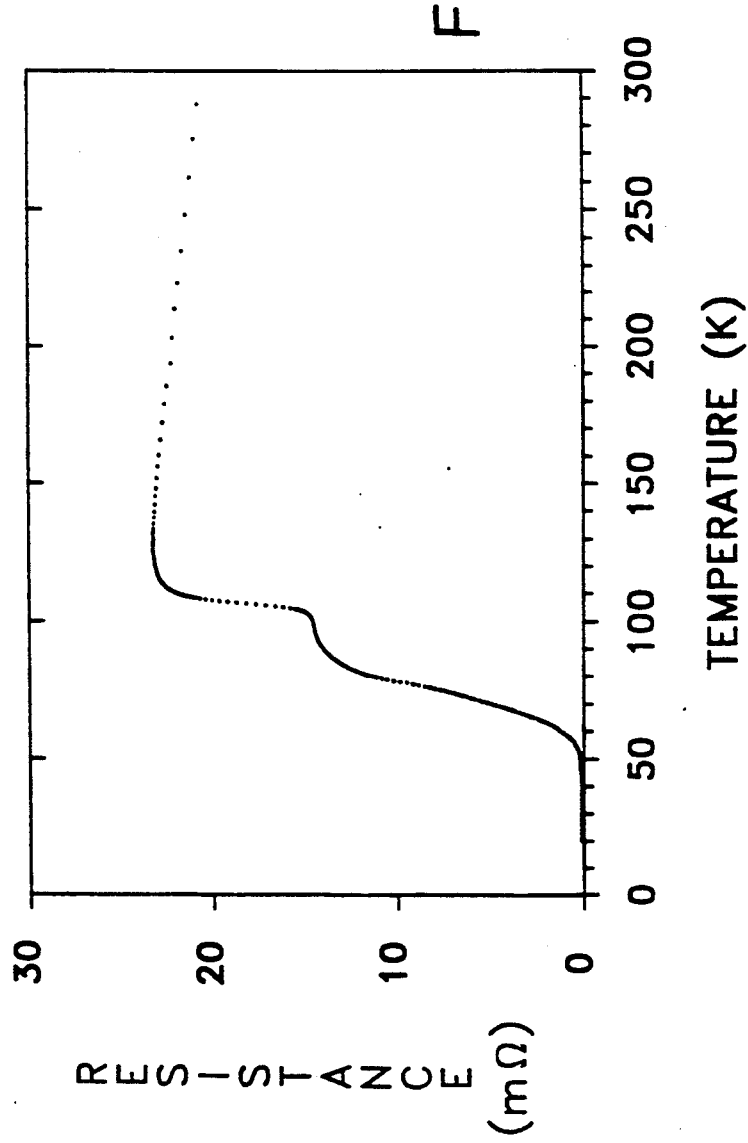

FIG. 3 illustrates the magnetic susceptibility data generated using the oxide of this example, wherein an AC current of 500 Hz was used to induce currents in the sample. As can be seen, the susceptibility remains virtually constant from 236.4° K. until the critical temperature of 110° K. is reached, whereupon the susceptibility sharply rises. Here again, the second upright phase of the graph between 70°–80° K. is indicative of the presence of a 2122 phase or pure bismuth compound.

While the double resistivity drops at $T_c$ about 110° K. and finally at 70°–80° K. is indicative of all bismuth based superconductors, with the presence of vanadium it could be easily changed to show only one resistivity drop at $T_c$ about 110° K. to zero resistivity; this will be described in Example 5.

Example 2

In this example, another vanadium-bismuth oxide is formed, namely $(VBi)_2Ca_2Sr_2Cu_3O_{r\pm t}$. As will be appreciated, this oxide differs from that described in Example 1 by the presence of equimolar fractions of vanadium and bismuth.

As in Example 1, the proper molecular weight proportions of $CaO, SrO, CuO, Bi_2O_3$ are employed, but in this instance vanadium pentoxide, $V_2O_5$, is employed. In the first step, the CaO, one-half of the SrO and CuO are mixed, ground and heated as set forth in the first step of Example 1.

In the next step, the remainder of the SrO as well as the bismuth and vanadium oxides are mixed and ground as specified in the second step of Example 1, whereupon the powder is pressed into pellets (7 mm diameter, 1 mm thickness). The pellets are then heated in a tube furnace at 780° C. for twenty hours, while argon is slowly passed through the tube. After the initial twenty hour treatment the temperature was raised to 850° C. for another twenty hours, with argon flow. After this heat treatment, the furnace was shut down and the pellets were allowed to cool to room temperature.

As described by P. C. W. Fung et al. in "Vanadium substituted 2212 and 2223 Superconducting Ceramics," *Solid State Communication*, vol. 75, pp. 211–216 (1990), the result of this example indicates that the experimental conclusion given by Cho et al. mentioned previously is incorrect, i.e., that there is no limit of 0.5 substitution of bismuth by vanadium. Moreover, vanadium pentoxide is necessarily unfavorable for the preparation of superconductors in accordance with the present invention.

Example 3

In this example, a 2122 oxide havintg the formula $(V_{0.25}Bi_{0.75})_2CaSr_2Cu_2O_8$ is formed. In the first step, A.R. grade powders of $V_2O_3$, $Bi_2O_3$, $CaCO_3$, $SrCO_3$ and CuO according to the above molar proportion are mixed and ground with an agate mortar and pestle for about three hours so that the powder has an average particle size at least as small as $10^{-3}$ mm. The mixture is then heated in an $Al_2O_3$ boat either in a muffle furnace (e.g., the "LMMF2" model, Carbolite Co. England) or a tube furnace (e.g., the "008", model Shanghai Experimental Furnace Factory, China) for about 24 hours at 800° C. while oxygen is passing through slowly at a pressure slightly above atmospheric. Then the furnace is turned off for about ten hours while keeping oxygen gas flowing. The resulting material is then ground again for about half an hour, and pressed to a pellet(s) of 7 to 13 mm in diameter, with a thickness of 1 to 2 mm under a pressure force of 4 to 10 tons. The pellet is then put back to the $Al_2O_3$ boat for annealing at 800° C. for about two days, while oxygen gas is passing through the furnace at reduced pressure. The pellet is then plunged into a cold environment, i.e., ice cubes or liquid nitrogen, to cool the pellet. The sample exhibits good Meissner effect.

Another 2122 oxide, $(VBi)_2CaSr_2Cu_2O_8$ is formed using a different technology. In the first step, an existing compound, $Bi_2CaSr_2Cu_2O_8$, is provided and is manually ground to at least an average particle size of $10^{-3}$ mm. Molecular weight per portions of $V_2O_3$, $CaCO_3$, $SrCO_3$ and CuO are mixed with the described bismuth compound, followed by further grinding to achieve a homogeneous mixture and particle size.

The ground mixture is then placed in a standard aluminum boat, ana the latter is placed within a tube furnace preheated to 750°-800° C. Pure oxygen is passed through the tube while heating proceeds at the noted temperature for a minimum of three days. Oxygen flow and power to the furnace is then terminated, and the compound is allowed to naturally cool to ambient temperature. The resulting powder is of a dull black color.

The powder is then pressed into a self-sustaining pellet of the type described above, and the pellet is placed back into the boat and put into the furnace for annealing. This involves heating to 750°-800° C. for approximately two hours.

In an alternate procedure, the same oxide may be synthesized by using $V_2O_5$; in this instance, an inert gas such as helium or argon is passed through the tube, rather than oxygen, and heating time is reduced to one day.

As can be appreciated, this example makes use of a bismuth host compound, with the vanadium being added to dope the original, starting compound.

FIG. 1 illustrates in schematic form the crystalline structure of the 2122 oxides in accordance with the invention. In this schematic showing, the planar representations indicate the presence of metallic ions I or M from the general formula given above, while the upright and inverted pyramidal representations indicate the presence of copper. The small circles between the planar and pyramidal representations, and between upright and inverted pyramidal representations, indicate the presence of the A and Q species of the general formula.

Example 4

In this example $V_2(Ca_{1-y}Bi_y)_2Sr_3Cu_3O_{12}$ is synthesized. $V_2O_3$, $CaCO_3$, $SrCO_3$, CuO and 0.1 $Bi_2O_3$ are mixed in molecular proportions to form the 2233 composition, with y being about 0.1, followed by fine grinding as described. The resultant powder is pressed into a pellet (about 12 mm diameter and 2 mm thickness). The pellet is then placed in the $Al_2O_3$ boat and inserted into the Lindberg Model 847 tube furnace which has been preheated to 1010° C. The sample is heated at 1010° C. in air for thirty (30) hours. Afterwards the pellet is annealed at 850° C. in oxygen for twenty four (24) hours and cooled to room temperature inside the furnace. This sample has a $T_c$ of about 80°-90° K. The significance of this example is that bismuth is a small fraction of the vanadium, indicating that a basic vanadium superconducting structure is possible as predicted by the EEM theory. However, such a structure is different from the predominantly bismuth structure as given in the previous examples.

B. OXIDES IN ACCORDANCE WITH FORMULA II

Example 5

A large number of samples in accordance with Formula II were prepared and tested. In these samples, the respective proportions of V and Pb were varied, and in certain instances the cooking conditions were changed.

In all instances, however, the precursor $Bi_{1.2}Sr_2Ca_2Cu_3O_{10\pm t}$ was formed by mixing and grinding the appropriate ratios of high purity $Bi_2O_3$, SrO, CaO and CuO in an agate mortar. The mixed powder is then placed in a tube furnace and heated at 820° C. in air for twenty (20) hours. After this heating step, the powder was removed from the furnace and reground. This procedure provided the above precursor.

Desired stoichiometric proportions of high purity $Bi_2O_3$, $V_2O_3$ and $PbO_2$ were then mixed with the precursor and the mixed powders were well ground. The compounds were then pressed into pellets (about 12 mm diameter and about 2 mm height) using a hydromatic press at a pressure of about 7000 kg/cm$^2$.

All samples were then sintered in a tube furnace (Lindberg Model 847 with quartz tube). The ends of the tube were opened to the air. The samples were first put in an alumina cylinder which was quickly introduced into the furnace maintained at a setting temperature and held there for a setting period. The samples were then quenched to room temperature by removing the cylinder from the furnace. The thermal treatments are set forth in Table 1 below. In all instances the samples were treated in the manner of Batch A, and then some of them were cut into pieces for further treatment.

The samples were then tested for electrical resistivity, using a four-probe technique with an AC current of 27 Hz. The electrical leads were secured to the samples by silver paste. The measurements were carried out in a commercial APD refrigerator with computer control and processing. The temperature range for the resistivity tests was from 16° K. to 300° K. Certain other samples were also tested for AC susceptibility. The technique used was that described by M. L. Norton, *J. Phys.* E 19, 268 (1986), which is incorporated by reference herein.

Table 2 sets forth the sample and batch numbers for the respective test samples, as well as the compositions thereof in terms of variable V and Pb ratios. The table also gives the critical temperature data derived for the tested samples.

Figure 34:
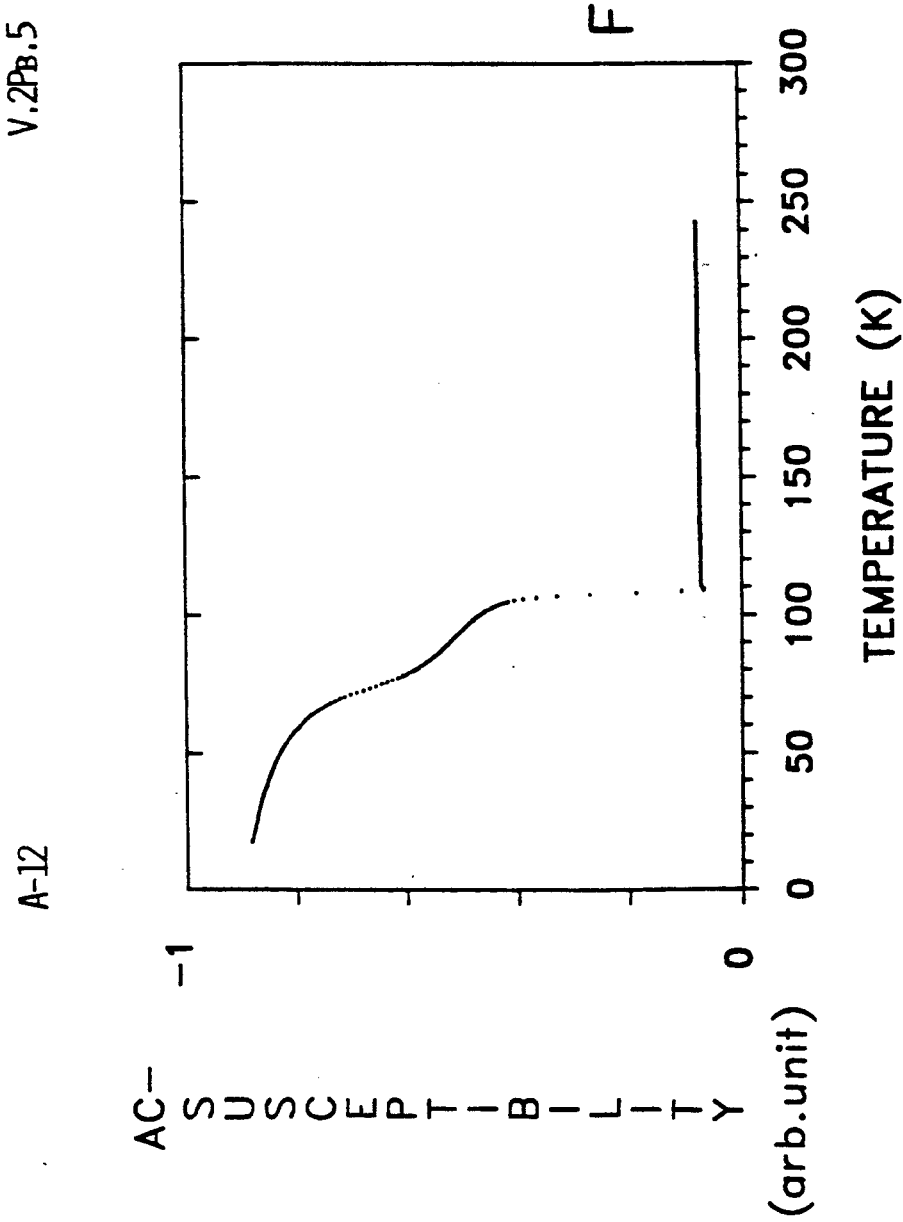
FIGS. 34–35 are graphical representations of the magnetic susceptibility characteristics of several Formula II superconducting oxides.
Figure 35:
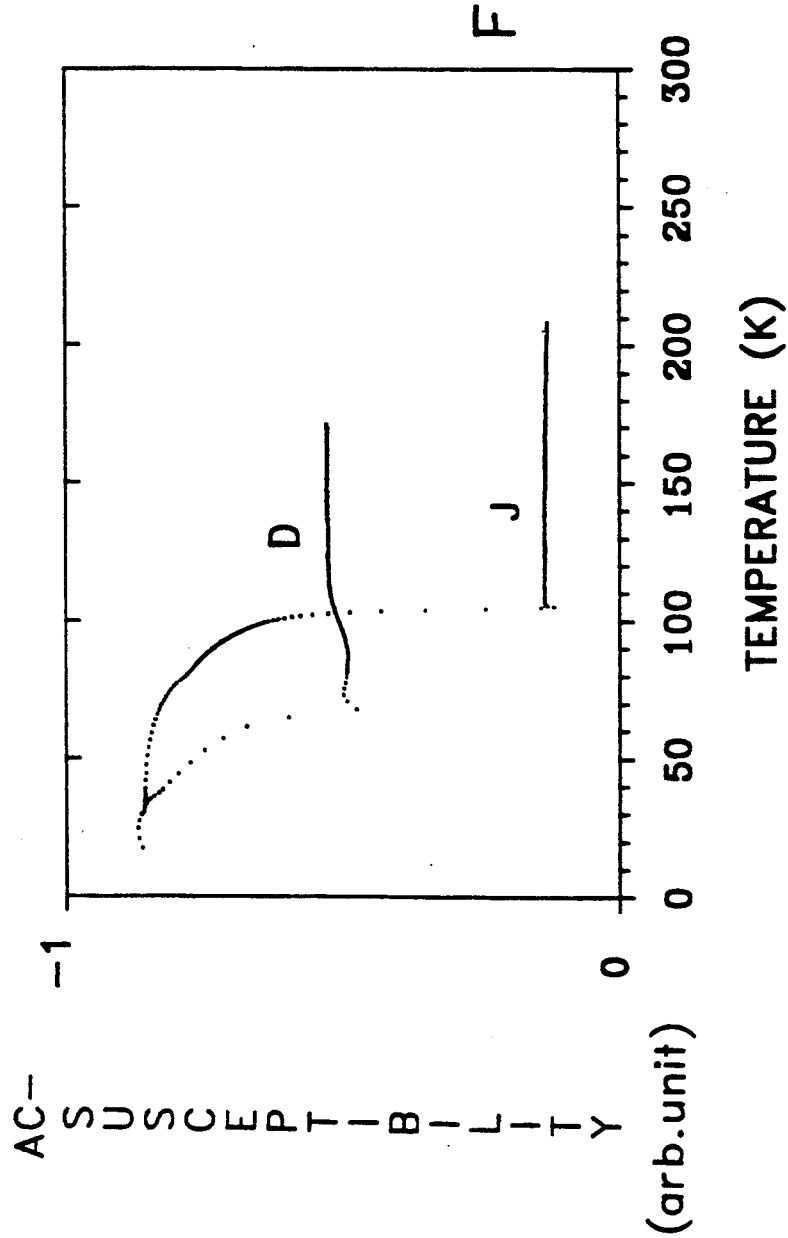

FIGS. 4-33 set forth the complete resistivity tests for the samples described in Table 2. In each figure a batch and sample number is given (e.g.,"A-2") which corresponds to Batch A and Sample 2 of Table 2. In like manner, FIGS. 34-35 give the complete susceptibility test results.

As mentioned earlier, the presence of V allows for easy preparation of single high $T_c$ phase superductors of the 2223 structure. In fact, it could be seen from the experimental results that as long as the total replacement of bismuth by vanadium and lead together in the range of 0.7 to 0.8, a single 110K. phase can be formed as described by the method given in Example 5.

Figure 36:
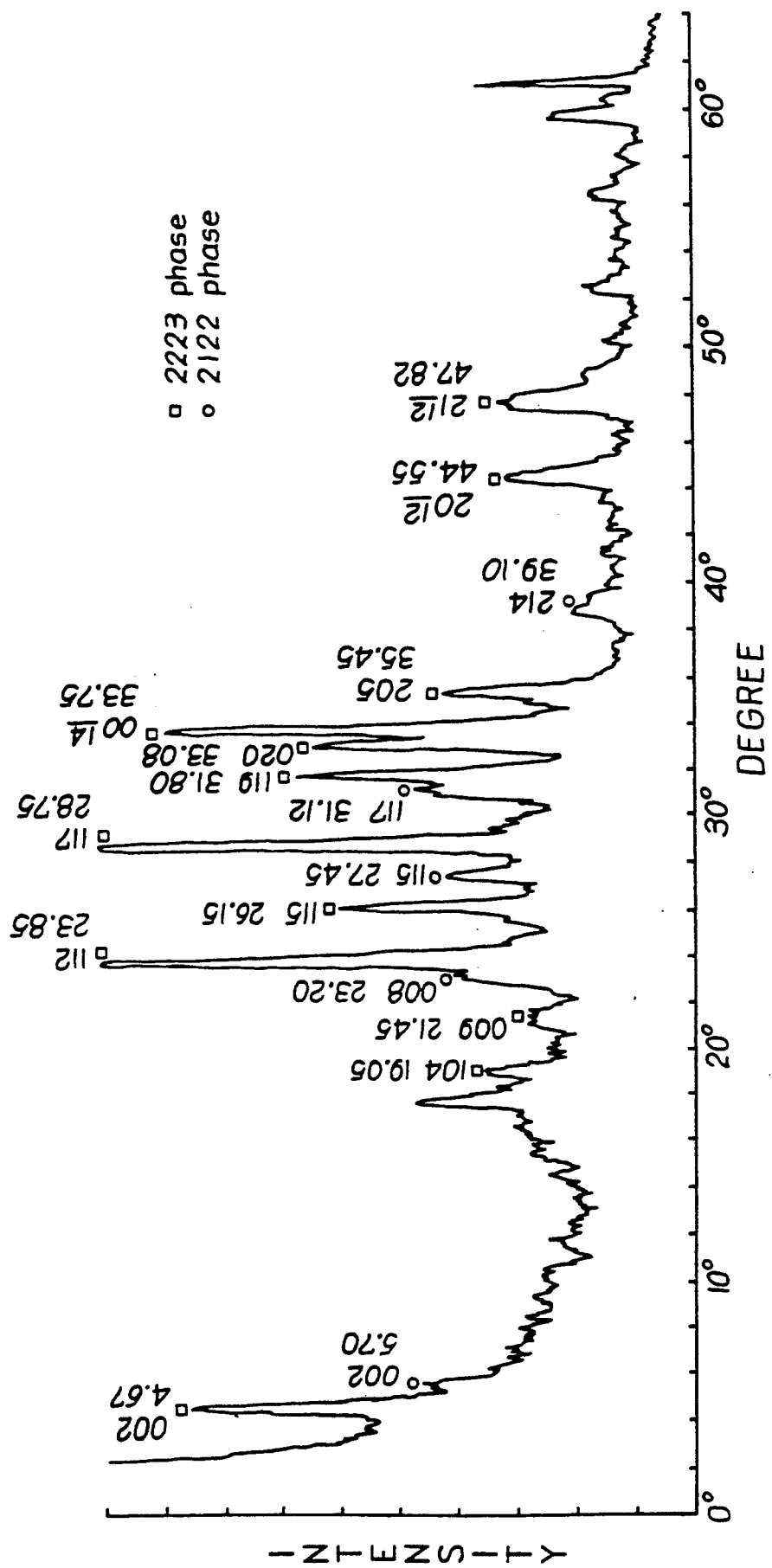
FIG. 36 is a graphic representation of an X-ray spectrum analysis of the oxide of sample number 12, batch J referred to in Table 2.

The basic structures are measured by X-ray techniques. A typical X-ray spectrum is given in FIG. 36 for sample 12, batch J. Values for the 2122 phase are denoted by circles, and values for the 2223 phase are denoted by asterisks. The measured crystal lattice parameters for the 2122 structure is a=5.389375 Angstroms, b=5.389999770 Angstroms, c=30.51887 Angstroms, and for the 2223 structure a=5.372849 Angstroms, b=5.404508 Angstroms, c=37.14170 Angstroms. A standard intensity ratio analysis gives greater than 95% 2223 phase in this sample.

Figure 37:
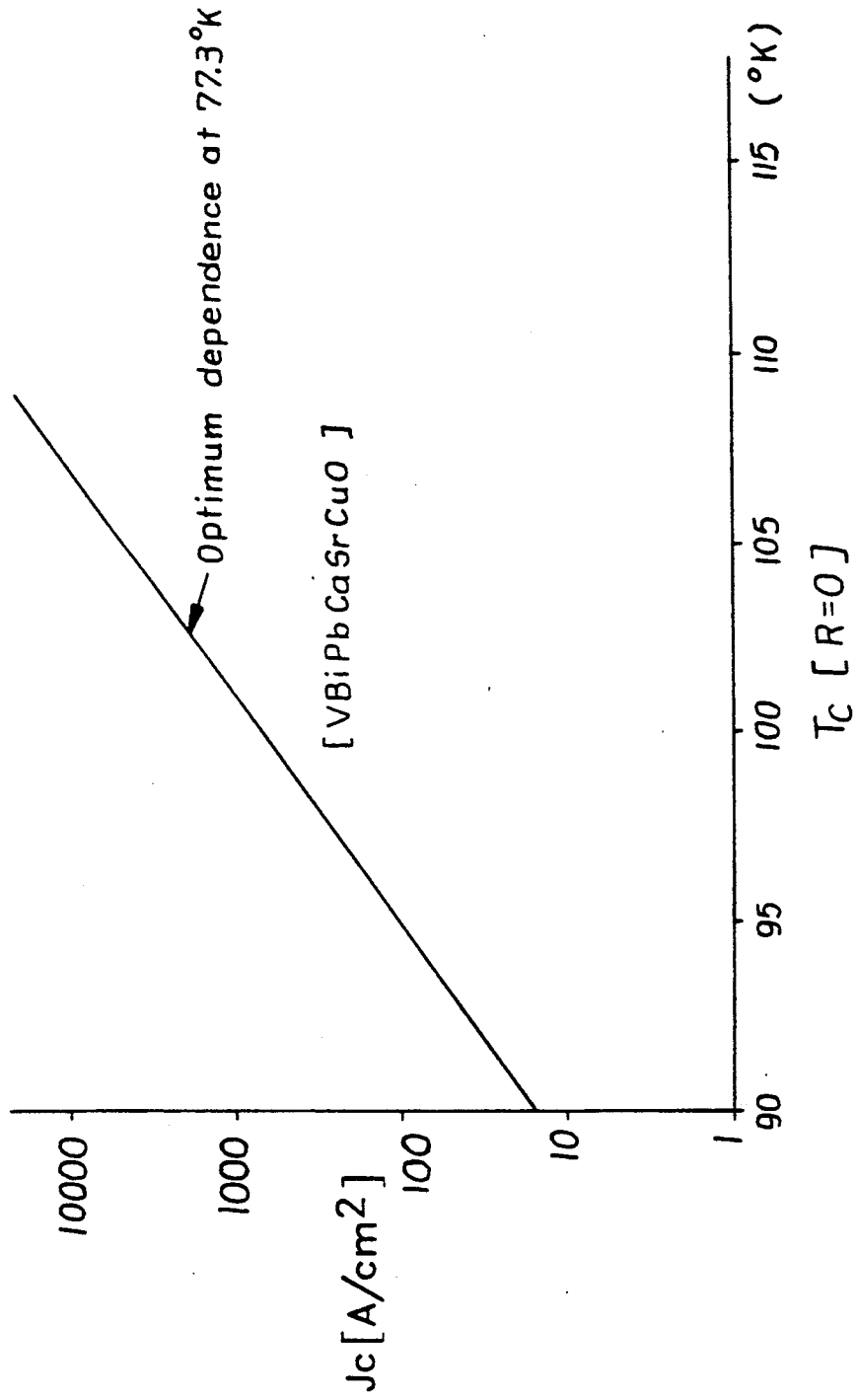
FIG. 37 is a graphic representation of the critical current density values of a superconducting oxide in accordance with Formula II of the invention.

FIG. 37 sets forth a plot of $J_c$ versus $T_c(R=0)$. This sample has a $J_c$ value at 77° K. greater than $3 \times 10^3$ A/cm2. Even higher $J_c$ values can be achieved by repeated pressing and reheating at 850° C. of the pellet, for 24 hours at a time.

TABLE 1

| BATCH NO. | THERMAL TREATMENT OF FORMULA II SAMPLES TREATMENT |
|---|---|
| A | 825° C. 55 hr., then 845° C. 25 hr., then 860° C. 36 hr. |
| B furance cooled | after Batch A treatment, 850° C. in Argon for 3 hr., |
| D furnace cooled | after Batch A. B treatment 600° C. in Oxygen for 20 hr., |
| F | after Batch A treatment, 865° C. for 42 hr. |
| G | after Batch A treatment, 750° C. for 5 hr. |
| I | after Batch A treatment, 870° C. for 20 hr. |
| J | after Batch A treatment, 830° C. for 20 hr. |

TABLE 2

TRANSITION TEMPERATURES AND COMPOSITIONS OF FORMULA II SAMPLES

| SAMPLES NO. | BATCH NO. | V (x) | Pb (y) | Tc(K) onset | Tc(K) zero |
|---|---|---|---|---|---|
| 1 | A | .1 | .1 | 114.80 | 67 |
| 2 | A | .1 | .2 | 114 | 102 |
| 2 | J | .1 | .2 | 115 | 105 |
| 3 | A | .1 | .3 | 114 | 93 |
| 4 | A | .1 | .4 | 114 | 94 |
| 5 | A | .1 | .5 | 110 | 86 |
| 6 | A | .1 | .6 | 104 | 82 |
| 7 | A | .1 | .7 | 104 | 79 |
| 7 | J | .1 | .7 | 117 | 104 |
| 8 | A | .2 | .1 | 114 | 90 |
| 9 | A | .2 | .2 | 115 | 94 |
| 9 | B | .2 | .2 | <16 | <16 |
| 9 | D | .2 | .2 | 72 | 68 |
| 9 | F | .2 | .2 | 118 | 93 |
| 9 | G | .2 | .2 | 116 | 96 |
| 9 | I | .2 | .2 | 107.88 | 70 |
| 9 | J | .2 | .2 | 116 | 102 |
| 10 | A | .2 | .3 | 116 | 98 |
| 11 | A | .2 | .4 | 114 | 100 |
| 12 | A | .2 | .5 | 118 | 103 |
| 12 | J | .2 | .5 | 118 | 108 |
| 13 | A | .2 | .6 | 116 | 97 |
| 15 | A | .3 | .2 | 115 | 54 |
| 16 | A | .3 | .3 | 115 | 95 |
| 17 | A | .3 | .4 | 116 | 89 |
| 18 | A | .3 | .5 | 114 | 97 |
| 19 | A | .4 | .1 | 113 | 47 |
| 20 | A | .4 | .2 | 112 | 83 |
| 21 | A | .4 | .3 | 110 | 83 |
| 22 | A | .4 | .4 | 110 | 86 |
| 23 | A | .5 | .1 | 110 | 87 |
| 24 | A | .5 | .2 | 112 | 80 |
| 25 | A | .5 | .3 | 109 | 80 |
| 26 | A | .6 | .1 | 110 | 90 |
| 27 | A | .6 | .2 | 112 | 98 |
| 28 | A | .7 | .1 | 112 | 65 |

We claim:
1. Superconducting oxides having predominantly an orthorhombic crystalline structure and being defined by the general formula

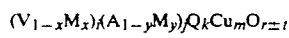

$$(V_{1-x}M_x)_i(A_{1-y}M_y)_jQ_kCu_mO_{r\pm t}$$

where M is respectively selected from the group consisting of bismuth, and lead, A is calcium, Q is different than A and is selected from the group consisting of strontium, barium and calcium, x and t are individual numbers each respectively ranging from 0 to less than 1, y is from 0 to about 0.2, i is either 2 or 3, j is either 0, 1 or 2, k is 2 or 3, m is either 1,2, or 3, r is an integer, and x and j are not simultaneously equal to 0, said oxide having a $T_c$ critical temperature of above about 100° K., said oxide having been formed by initially mixing respective quantities of oxides of A, Q and Cu, sintering said initial mixture to form a precursor crystal structure, adding a quantity of at least vanadium oxide to the so-formed precursor crystal structure and sintering the resultant mixture to yield said oxide.

2. Superconducting oxides as set forth in claim 1, wherein M is bismuth, A is calcium, Q is strontium, i is 2, j is 1 and m is 2 and r is 10.

3. Superconducting oxides as set forth in claim 2, wherein x is about 0.90 and t ranges from about 0 to 0.2.

4. Superconducting oxides as set forth in claim 1, wherein x is zero, A is calcium, M is bismuth, Q is strontium, y is 0.1, i is 2, j is 2, k is 3, m is 3, and r is 10.

5. Superconducting oxides as set forth in claim 1, wherein r ranges from about 8 to 12.

6. Superconducting oxides as set forth in claim 1, wherein x ranges from about 0 to 0.90.

7. Superconducting oxides as set forth in claim 1, wherein t ranges from about 0 to 0.2.

8. Superconducting oxides as set forth in claim 1, said compounds exhibiting a generally linearly decreasing electrical resistivity as the temperature thereof is lowered from about 200° K. to about the critical temperature ($T_c$) thereof.

9. Superconducting oxides as set forth in claim 1, said oxides having a critical current value ($J_c$) of about $10^4$ amperes/cm² or more.

10. Superconducting oxides defined by the general formula $$Bi_{2p-q}V_pPb_qSr_2Ca_2Cu_3O_{10\pm t}$$

where p and q each independently range up to about 0.7, P being greater than zero and t ranges between 0 and less than 1, said oxide having a $T_c$ critical temperature of above about 100° K., said oxide having been formed by initially mixing respective quantities of oxides of Bi, Sr, Ca and Cu, sintering said initial mixture to form a precursor crystal structure, adding respective quantities of V and Pb to the so-formed precursor crystal structure, and sintering the resultant mixture to yield said oxide.

11. Superconducting oxides as set forth in claim 18, p and q each independently ranging from about 0.05 to 0.7.

* * * * *

UNITED STATES PATENT AND TRADEMARK OFFICE
CERTIFICATE OF CORRECTION

PATENT NO. : 5,098,868

DATED : March 24, 1992

INVENTOR(S) : Wong, et al.

It is certified that error appears in the above-identified patent and that said Letters Patent is hereby corrected as shown below:

Column 11, line 3 of Claim 10, insert "-" after the subscript "2" and before the subscript "p".

Signed and Sealed this

Twenty-first Day of September, 1993

Attest:

BRUCE LEHMAN

Attesting Officer     Commissioner of Patents and Trademarks